United States Patent
Oshima et al.

(10) Patent No.: US 10,460,934 B2
(45) Date of Patent: Oct. 29, 2019

(54) CRYSTALLINE FILM, SEMICONDUCTOR DEVICE INCLUDING CRYSTALLINE FILM, AND METHOD FOR PRODUCING CRYSTALLINE FILM

(71) Applicants: FLOSFIA INC., Kyoto (JP); NATIONAL INSTITUTE FOR MATERIALS SCIENCE, Ibaraki (JP); KYOTO UNIVERSITY, Kyoto (JP); SAGA UNIVERSITY, Saga (JP)

(72) Inventors: Yuichi Oshima, Ibaraki (JP); Shizuo Fujita, Kyoto (JP); Kentaro Kaneko, Kyoto (JP); Makoto Kasu, Saga (JP); Katsuaki Kawara, Kyoto (JP); Takashi Shinohe, Kyoto (JP); Tokiyoshi Matsuda, Kyoto (JP); Toshimi Hitora, Kyoto (JP)

(73) Assignees: FLOSFIA INC., Kyoto (JP); NATIONAL INSTITUTE FOR MATERIALS SCIENCE, Ibaraki (JP); KYOTO UNIVERSITY, Kyoto (JP); SAGA UNIVERSITY, Saga (JP)

( * ) Notice: Subject to any disclaimer, the term of this patent is extended or adjusted under 35 U.S.C. 154(b) by 0 days.

(21) Appl. No.: 16/106,753

(22) Filed: Aug. 21, 2018

(65) Prior Publication Data

US 2019/0057865 A1    Feb. 21, 2019

(30) Foreign Application Priority Data

Aug. 21, 2017 (JP) .................. 2017-158306
Mar. 19, 2018 (JP) .................. 2018-050516
Jun. 26, 2018 (JP) .................. 2018-120457

(51) Int. Cl.
*H01L 21/02* (2006.01)
*H01L 29/24* (2006.01)
(Continued)

(52) U.S. Cl.
CPC .... *H01L 21/02565* (2013.01); *H01L 21/0242* (2013.01); *H01L 21/0262* (2013.01);
(Continued)

(58) Field of Classification Search
CPC ......... H01L 21/02565; H01L 21/02609; H01L 21/02483; H01L 21/02433; H01L 29/872;
(Continued)

(56) References Cited

U.S. PATENT DOCUMENTS

2014/0145183 A1*  5/2014  Yamazaki ......... H01L 21/02472
                                                257/43
2015/0194479 A1    7/2015  Kaneko et al.
(Continued)

FOREIGN PATENT DOCUMENTS

JP          5343224       11/2013
JP          5397794        1/2014
(Continued)

OTHER PUBLICATIONS

Rustum Roy et al., "Polymorphism of $Ga_2O_3$ and the System $Ga_2O_3$-$H_2O$", Contribution from School of Mineral Industries, The Pennsylvania State College, Feb. 5, 1952, vol. 74, pp. 719-722.
(Continued)

*Primary Examiner* — John P. Dulka
(74) *Attorney, Agent, or Firm* — Wenderoth, Lind & Ponack, L.L.P.

(57) ABSTRACT

According to an aspect of a present inventive subject matter, a crystalline film includes a crystalline metal oxide as a major component, the crystalline film includes a corundum structure, a surface area that is 9 $\mu m^2$ or more, and a dislocation density that is less than $5 \times 10^6$ $cm^{-2}$.

29 Claims, 23 Drawing Sheets

(51) Int. Cl.
*H01L 29/04* (2006.01)
*H01L 29/872* (2006.01)

(52) U.S. Cl.
CPC .. *H01L 21/02433* (2013.01); *H01L 21/02483* (2013.01); *H01L 21/02609* (2013.01); *H01L 21/02636* (2013.01); *H01L 29/04* (2013.01); *H01L 29/24* (2013.01); *H01L 29/872* (2013.01)

(58) Field of Classification Search
CPC ............... H01L 29/04; H01L 21/02636; H01L 21/0262; H01L 21/0242; H01L 29/24
See application file for complete search history.

(56) References Cited

U.S. PATENT DOCUMENTS

2015/0225843 A1 8/2015 Oda et al.
2019/0055667 A1* 2/2019 Oshima ................. C30B 25/186

FOREIGN PATENT DOCUMENTS

| | | |
|---|---|---|
| JP | 5397795 | 1/2014 |
| JP | 2014-072533 | 4/2014 |
| JP | 2016-098166 | 5/2016 |
| JP | 2016-100592 | 5/2016 |
| JP | 2016-100593 | 5/2016 |
| JP | 2016-155714 | 9/2016 |
| WO | 2014/050793 | 4/2014 |

OTHER PUBLICATIONS

Kentaro Kaneko, "Growth and physical properties of corundum-structured gallium oxide alloy thin films", Dissertation, Kyoto Univ., issued in Mar. 2013, Disclosed on Jan. 31, 2014 pp. 1-116 with English language abstract.

* cited by examiner

CRYSTALLINE FILM, SEMICONDUCTOR DEVICE INCLUDING CRYSTALLINE FILM, AND METHOD FOR PRODUCING CRYSTALLINE FILM

CROSS-REFERENCE TO RELATED APPLICATION

This application is a new U.S. patent application that claims priority benefit of Japanese patent applications No. 2017-158306 filed on Aug. 21, 2017, No. 2018-050516 filed on Mar. 19, 2018, and No. 2018-120457 filed on Jun. 26, 2018, the disclosures of which are incorporated herein by reference in its entirety.

BACKGROUND OF THE INVENTION

Field of the Invention

The present disclosure relates to a crystalline film. Also, the present disclosure relates to a semiconductor device including a crystalline film. Furthermore, the present disclosure relates to a method for producing a crystalline film.

Description of the Related Art

As a background, gallium oxide ($Ga_2O_3$) is known to possess five different polymorphs including α-, β-, γ-, δ-, and ε-phases (for reference, see NPL1: Rustum Roy et al, "Polymorphism of $Ga_2O_3$ and the System $Ga_2O_3$-$H_2O$").

Among these five polymorphs, β-$Ga_2O_3$ is believed to be thermodynamically the most stable, and α-$Ga_2O_3$ is believed to be metastable. Gallium oxide ($Ga_2O_3$) exhibits wide band gap and attracts more attention as a potential semiconductor material for semiconductor devices.

According to NPL 2, it is suggested that a band gap of gallium oxide ($Ga_2O_3$) is able to be controlled by forming mixed crystal with indium and/or aluminum (for reference, see NPL 2: Kentaro KANEKO, "Fabrication and physical properties of corundum-structured alloys based on gallium oxide", Dissertation, Kyoto Univ., issued in March 2013, summary and contents were open to the public on Jan. 31, 2014). Among them, InAlGaO based semiconductors represented by $In_XAl_YGa_ZO_3$ ($0 \le X \le 2$, $0 \le Y \le 2$, $0 \le Z \le 2$, $X+Y+Z=1.5$ to $2.5$) are extremely attractive materials (for reference, see PCT international publication No. WO2014/050793A1).

However, since β-phase is the most stable phase of gallium oxide, it is difficult to form a metastable corundum-structured crystalline film of gallium oxide without using a suitable film-formation method. Also, bulk substrates obtained from melt-growth are not available for α-$Ga_2O_3$ that is corundum-structured and metastable. Accordingly, sapphire substrates having a same structure as the corundum structure α-$Ga_2O_3$ has are used to form α-$Ga_2O_3$ on the sapphire substrates, however, lattice mismatch of sapphire and α-$Ga_2O_3$ is not small ($\Delta a/a$~4.5%, $\Delta c/c$~3.3%) and thus, α-$Ga_2O_3$ crystalline film hetero-epitaxially grown on a sapphire substrate tends to include a high density of dislocations. Furthermore, there are further challenges to accelerate film-formation speed, to enhance quality of a crystalline film of α-phase gallium oxide and/or a crystalline film of mixed crystal of α-phase gallium oxide, to suppress crystal defects including occurrence of cracks, abnormal growth, crystal twinning, and/or curves of crystalline film. Under such circumstances, researches of corundum-structured crystalline semiconductor films are ongoing.

It is open to the public that a crystalline film of oxide is produced by a mist chemical vapor deposition (CVD) method using bromide or iodide of gallium and/or indium (see Japanese patent publication No. 5397794). Also, it is open in public that a multilayer structure includes a corundum-structured semiconductor layer on a corundum-structured base substrate, and a corundum-structured insulating layer (see Japanese patent publications No. 5343224 and No. 5397795 and unexamined Japanese patent publication No. JP2014-72533). Furthermore, film-formation by a mist CVD method using ELO substrates and void formation is disclosed (see unexamined Japanese patent publications No. 2016-100592, No. 2016-98166, No. 2016-100593, and No. 2016-155714). Also, it is open to the public that a corundum-structured gallium oxide film is formed by a halide vapor phase epitaxy (HYPE) method. However, there is a room for improvement in the rate or speed for forming a film, and a method for producing a crystalline film with a sufficient speed has been desired.

Also, considering that α-$Ga_2O_3$ is metastable, α-$Ga_2O_3$ films and crystalline films of crystalline metal oxide containing gallium and one or more metals are more difficult to form with suppressed defect density, compared to the case of stable β-$Ga_2O_3$, and thus, there are still various challenges to cope with for obtaining α-$Ga_2O_3$ films and crystalline films of crystalline metal oxide containing gallium and one or more metals.

SUMMARY OF THE INVENTION

According to a first aspect of a present inventive subject matter, a crystalline film contains a crystalline metal oxide as a major component, and the crystalline film includes a corundum structure, a surface area that is 9 $\mu m^2$ or more, and a dislocation density that is less than $5 \times 10^6$ $cm^{-2}$.

According to an embodiment of a present inventive subject matter, the surface area that is 9 $\mu m^2$ or more contains an epitaxial lateral overgrowth layer of the crystalline metal oxide.

It is suggested that a crystalline film contains an epitaxial lateral overgrowth of crystalline metal oxide grown in at least a direction perpendicular to a ($10\bar{1}4$) plane.

According to a second aspect of a present inventive subject matter, a crystalline film contains a crystalline metal oxide as a major component; and an epitaxial lateral overgrowth of the crystalline metal oxide grown in at least a direction perpendicular to a ($10\bar{1}4$) plane.

Also, it is disclosed that the crystalline metal oxide contains gallium, a surface area that is 9 $\mu m^2$ or more, and a dislocation density that is less than $5 \times 10^6$ $cm^{-2}$.

Furthermore, it is suggested that the crystalline metal oxide may further contains at least one metal selected from among aluminum, indium, iron, chromium, vanadium, titanium, rhodium, nickel, cobalt, and iridium.

According to an embodiment of a crystalline film, the surface area of the crystalline film may be 1 $mm^2$ or more.

Also, according to an embodiment of a crystalline film, it is suggested that the crystalline film may contain a dopant.

According to a third aspect of a present inventive subject matter, a semiconductor device includes the crystalline film, a first electrode electrically connected to the crystalline film, and a second electrode electrically connected to the crystalline film.

According to a fourth aspect of a present inventive subject matter, a semiconductor device includes a crystalline film containing a crystalline metal oxide as a major component, and the crystalline film has a dislocation density that is less than $5\times10^6$ cm$^{-2}$. The crystalline film has a surface area that is 9 μm² or more. The semiconductor further includes a first electrode electrically connected to the crystalline film, a second electrode electrically connected to the crystalline film. The crystalline film may further contain a dopant.

According to a fifth aspect of a present inventive subject matter, a semiconductor device includes a crystalline film includes a crystalline metal oxide as a major component and an epitaxial lateral overgrowth layer of the crystalline metal oxide grown in at least a direction perpendicular to a (10$\bar{1}$4) plane.

According to a sixth aspect of a present inventive subject matter, a method for producing a crystalline film includes gasifying a metal source to turn the metal source into a metal-containing raw-material gas; supplying the metal-containing raw-material gas and an oxygen-containing raw-material gas into a reaction chamber onto a substrate on that an uneven portion including at least one mask and/or at least one opening is arranged; and supplying a reactive gas into the reaction chamber onto the substrate to grow at least one island of crystalline metal oxide vertically, laterally and/or radially at the at least one opening of the uneven portion on the substrate under a gas flow of the reactive gas such that the at least one island of crystalline metal oxide to form an epitaxial lateral overgrowth layer of the crystalline metal oxide.

According to an embodiment of a method for forming a crystalline film, the at least one opening of the uneven portion may include two or more openings, and the at least one island may include two or more islands of crystalline metal oxide at the two or more openings. According to an embodiment of a method for producing a crystalline film, the two or more islands of the crystalline metal oxide coalesce to form an epitaxial lateral overgrowth layer of the crystalline metal oxide.

Also, it is suggested that the reactive gas is an etching gas.

According to an embodiment of a method for producing a crystalline film of a present inventive subject matter, the reactive gas may contain at least one selected from among hydrogen halide and groups containing halogen and hydrogen.

Also, according to an embodiment of a method for producing a crystalline film of a present inventive subject matter, the at least one mask of the uneven portion includes a sheet-shaped mask with the two or more openings arranged on a surface of the substrate. The two or more openings of the sheet-shaped mask on the substrate are regularly arranged on the surface of the substrate.

It is suggested that the substrate is heated at a temperature in a range of 400° C. to 700° C.

Also, according to an embodiment of a method for producing a crystalline film of a present inventive subject matter, the metal source contains a gallium source, and the metal-containing raw-material gas contains a gallium-containing raw-material gas.

It is suggested that the gasifying the metal source is done by halogenating the metal source.

According to an embodiment of a method for producing a crystalline film of a present inventive subject matter, the oxygen-containing raw-material gas contains at least one selected from among oxygen ($O_2$), water ($H_2O$) and nitrous oxide ($N_2O$).

Also, it is suggested that the substrate has a corundum structure, and the crystalline film has a corundum structure.

According to an embodiment of a method for producing a crystalline film of a present inventive subject matter, the substrate may include a buffer layer formed on at least a surface of the substrate, and the uneven portion on the substrate is positioned on the buffer layer. The buffer layer is suggested to be formed by use of a mist chemical vapor deposition (CVD) method.

Also, it is suggested that the forming the crystalline film of metal oxide under the gas flow of the reactive gas is done by use of a halide vapor phase epitaxy (HVPE) method.

According to an embodiment of a method for producing a crystalline film of a present inventive subject matter, the forming the crystalline film of metal oxide may be done at a growth rate that is 5 μm/h or more.

According to an embodiment of a method for producing a crystalline film of a present inventive subject matter, the at least one mask of the uneven portion may include two or more elongated masks arranged in parallel with one of the two or more openings positioned between adjacently arranged two of the elongated masks.

Furthermore, according to an embodiment of a method for producing a crystalline film of a present inventive subject matter, the at least one mask and the at least one opening of the uneven portion includes a sheet-shaped mask including two or more openings that are arranged at a regular interval that is in a range of 3 μm or more to 100 μm or less.

Also, according to an embodiment of a method for producing a crystalline film of a present inventive subject matter, at least one mask of an uneven portion includes dot-patterned masks that are arranged at a regular interval that is in a range of 3 μm or more to 100 μm or less.

According to an embodiment, a method for producing a crystalline film of a present inventive subject matter includes forming an uneven portion on a surface of the crystalline film that is a first crystalline film of the crystalline oxide; and forming a second crystalline film on the uneven portion on the surface of the first crystalline film of the crystalline oxide.

It is suggested that the first crystalline film may be formed as a sacrificial layer that is to be peel-off such that the second crystalline film is separable from the uneven portion on the surface of the first crystalline film.

According to an embodiment of a method for producing a crystalline film, the forming the uneven portion on the surface of the first crystalline film is suggested to be done by arranging at least one mask comprising two or more metals, a metal compound, and/or a nonmetallic compound on the surface of the first crystalline film.

According to an embodiment of a crystalline film of a present inventive subject matter,
the crystalline film may include a first crystalline film containing a crystalline gallium oxide as a major component or a mixed crystal as a major component containing gallium and one or more metals, and a second crystalline film containing a crystalline gallium oxide as a major component or a mixed crystal as a major component containing gallium and one or more metals.

Also, according to a seventh aspect of a present inventive subject matter, a method for producing a crystalline film includes: gasifying a metal source to turn the metal source into a metal-containing raw-material gas; supplying the metal-containing raw-material gas and an oxygen-containing raw-material gas into a reaction chamber onto a substrate on that an uneven portion is arranged; and supplying a reactive gas into the reaction chamber onto the substrate to grow a crystalline film on the uneven portion on the substrate under a gas flow of the reactive gas. The uneven portion on the substrate may be grooves. Furthermore, it is suggested that the method for producing a crystalline film may include forming grooves on a surface of the substrate as the uneven portion.

DETAILED DESCRIPTION OF EMBODIMENTS

Figure 1:
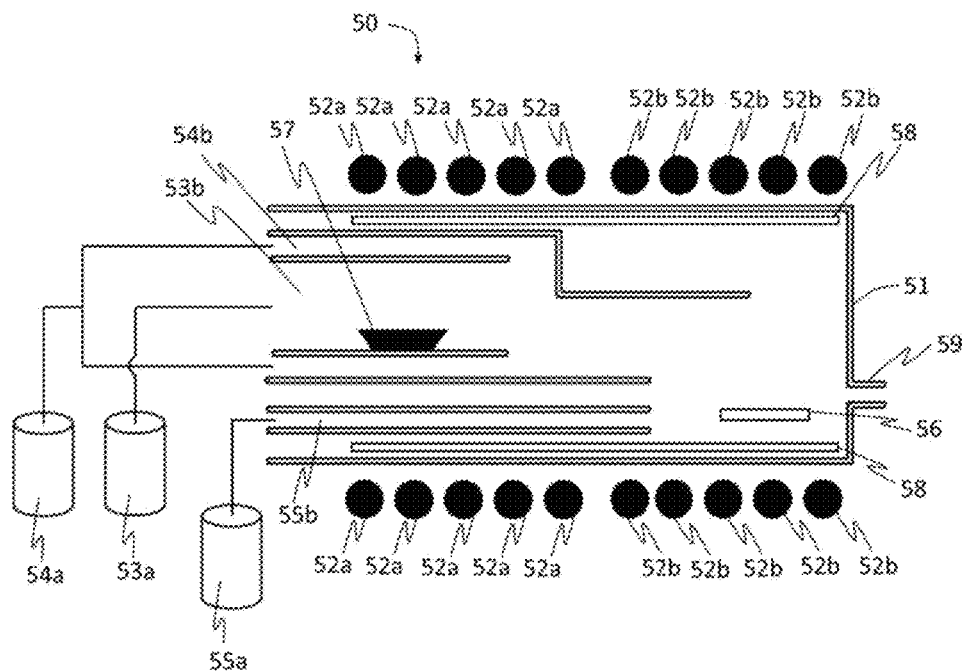
FIG. 1 shows a schematic perspective view showing a halide vapor phase epitaxy (HVPE) apparatus that is used in embodiments of a method for producing a crystalline film according to a present inventive subject matter.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

According to a first aspect of a crystalline film of a present inventive subject matter, a crystalline film contains a crystalline metal oxide as a major component. The crystalline film including a corundum structure, a surface area that is 9 $\mu m^2$ or more, and a dislocation density that is less than $5 \times 10^6$ $cm^{-2}$.

Also, according to a second aspect of a crystalline film of a present inventive subject matter, a crystalline film contains a crystalline metal oxide as a major component, and an epitaxial lateral overgrowth of the crystalline metal oxide grown in at least a direction perpendicular to a ($10\bar{1}4$) plane.

According to a third aspect of a present inventive subject matter, a semiconductor device includes the crystalline film, a first electrode electrically connected to the crystalline film, and a second electrode electrically connected to the crystalline film.

According to a fourth aspect of a present inventive subject matter, a semiconductor device includes a crystalline film containing a crystalline metal oxide as a major component, and the crystalline film has a dislocation density that is that is less than $5 \times 10^6$ $cm^{-2}$. The crystalline film has a surface area that is 9 $\mu m^2$ or more. The semiconductor further includes a first electrode electrically connected to the crystalline film, a second electrode electrically connected to the crystalline film. The crystalline film may further contain a dopant.

Also, according to a fifth aspect of a present inventive subject matter, a semiconductor device includes a crystalline film includes a crystalline metal oxide as a major component and an epitaxial lateral overgrowth layer of the crystalline metal oxide grown in at least a direction perpendicular to a ($10\bar{1}4$) plane.

According to a sixth aspect of a present inventive subject matter, a method for producing a crystalline film includes gasifying a metal source to turn the metal source into a metal-containing raw-material gas; supplying the metal-containing raw-material gas and an oxygen-containing raw-material gas into a reaction chamber onto a substrate on that an uneven portion including at least one mask and/or at least one opening is arranged; and supplying a reactive gas into the reaction chamber onto the substrate to grow at least one island of crystalline metal oxide vertically, laterally and/or radially at the at least one opening of the uneven portion on the substrate under a gas flow of the reactive gas such that the at least one island of crystalline metal oxide to form an epitaxial lateral overgrowth layer of crystalline metal oxide.

According to an embodiment of a method for forming a crystalline film, the at least one opening of the uneven portion may include two or more openings, and the at least one island may include two or more islands of crystalline metal oxide at the two or more openings. The two or more islands of the crystalline metal oxide coalesce to form an epitaxial lateral overgrowth layer of the crystalline metal oxide.

(Metal Source)

The metal source is not particularly limited as long as the metal source contains at least one metal and is able to be gasified. The metal source may be a metal source of an elemental metal. Also, the metal source may be a metal source of metal compound. Examples of metal contained in the metal source include gallium, aluminum, indium, iron, chromium, vanadium, titanium, rhodium, nickel, cobalt, and iridium. One or more metals may be contained in the metal source.

According to an embodiment of a present inventive subject matter, a crystalline film contains a crystalline metal oxide as a major component. In this embodiment, the metal of the metal source may be at least one selected from among gallium, aluminum, and indium, but most preferably the metal of the metal source is a gallium source. Also, the metal source may be a gaseous source, a liquid source, and a solid source, however, if the metal of the metal source is gallium, a liquid source of gallium is preferable.

Furthermore, the crystalline metal oxide may further contain at least one metal selected from among aluminum, indium, iron, chromium, vanadium, titanium, rhodium, nickel, cobalt and iridium, in addition to gallium, according to another embodiment of a present inventive subject matter.

Gasifying a metal source to turn the metal source into a metal-containing raw-material gas is not particularly limited as long as an object of a present inventive subject matter is not interfered with and may be done by a known method. In embodiments of a present inventive subject matter, gasifying a metal source to turn the metal source into a metal-containing raw-material gas is preferably done by halogenating the metal source. A halogenating agent used for halogenating the metal source is not particularly limited as long as the metal source is able to be halogenated and may be a known halogenating agent. The halogenating agent may be halogen and/or hydrogen halide. Examples of halogen include fluorine, chlorine, bromine, and iodine. Also, examples of hydrogen halide include hydrogen fluoride, hydrogen chloride, hydrogen bromide, and hydrogen iodide. In embodiments of a present inventive subject matter, halogenating the metal source by use of hydrogen halide is preferable, and halogenating the metal source by use of hydrogen chloride is further preferable. In an embodiment of a method for producing a crystalline film, halogenating the metal source is preferably done by supplying halogen or hydrogen halide as a halogenating agent to the metal source and causing a reaction of the metal source and the halogenating agent at a vaporization temperature of a metal halide or higher temperatures of the vaporization temperature of the metal halide. The vaporization temperature is not particularly limited, however, in an embodiment that the metal of the metal source is gallium and the halogenating agent is hydrogen chloride, the vaporization temperature is preferably 900° C. or less, and further preferably 700° C. or less. The vaporization temperature is most preferably in a range of 400° C. to 700° C.

The metal-containing raw-material gas is not particularly limited as long as the metal-containing raw-material gas is a gas containing the metal of the metal source. Examples of the metal-containing raw-material gas may be a halogenating agent such as fluoride, chloride, bromide and iodide.

Figure 4:
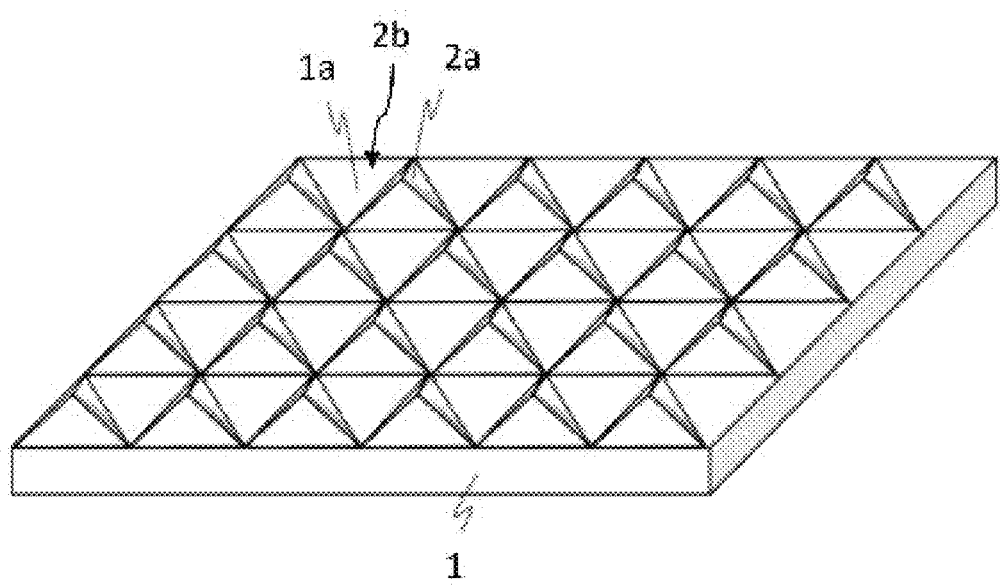
FIG. 4 shows a schematic perspective view of a substrate with an uneven portion formed on a surface of the substrate according to a present inventive subject matter as an example.
Figure 5:
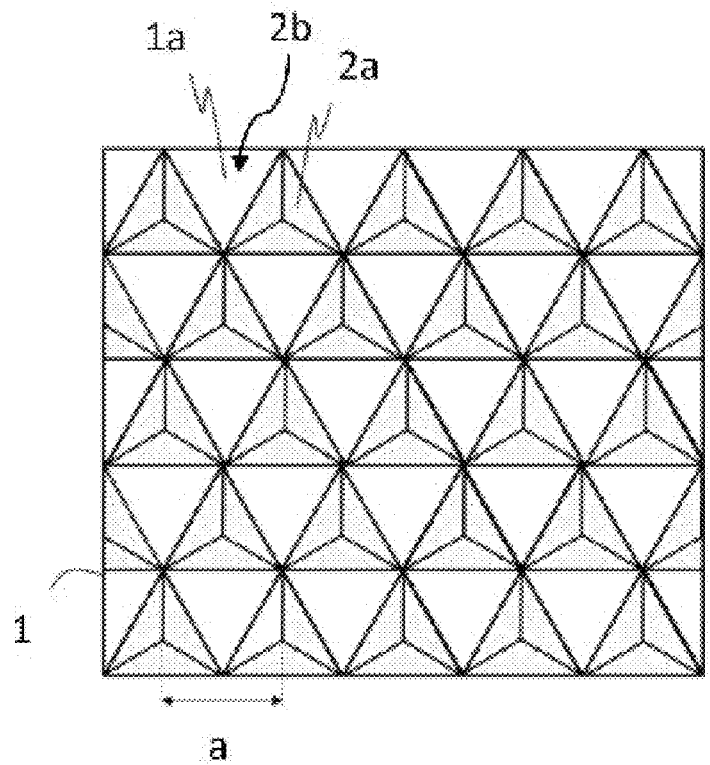
FIG. 5 shows a top plan view of a substrate with an uneven portion formed on a surface of the substrate according to a present inventive subject matter as an example.
Figure 6A:
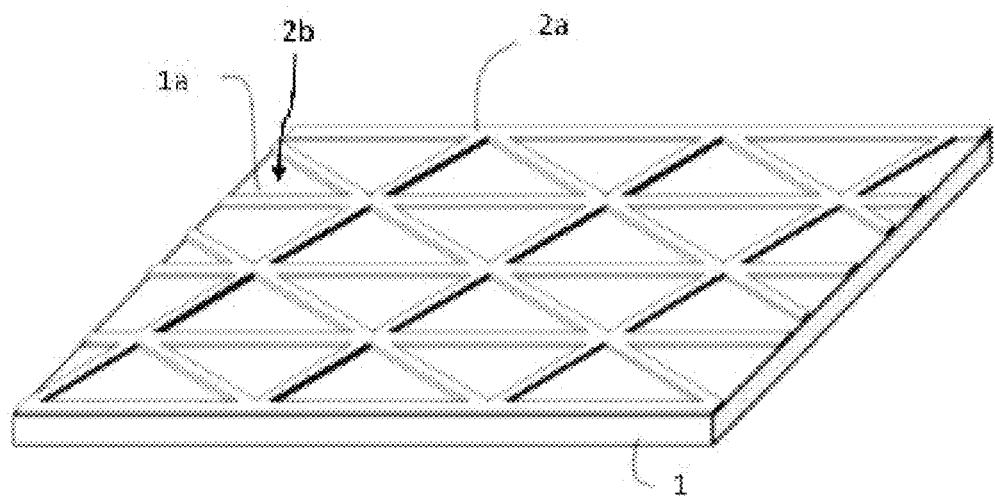
FIG. 6A shows a schematic perspective view of a substrate with an uneven portion formed on a surface of the substrate according to a present inventive subject matter as an example.
Figure 6B:
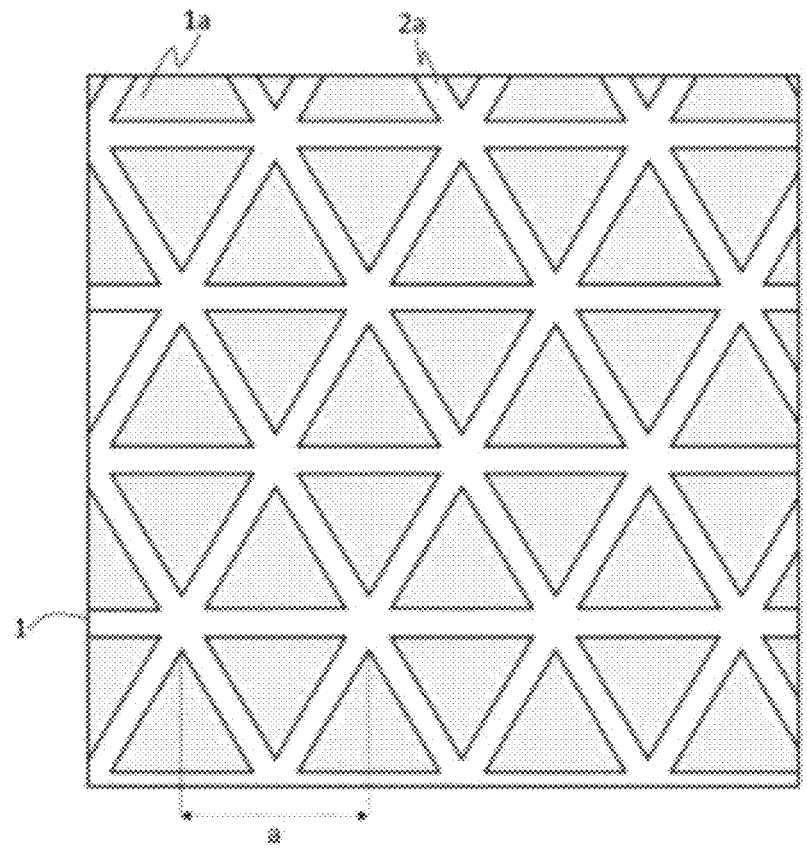
FIG. 6B shows a schematic top plan view of the substrate shown in FIG. 6A.
Figure 13:
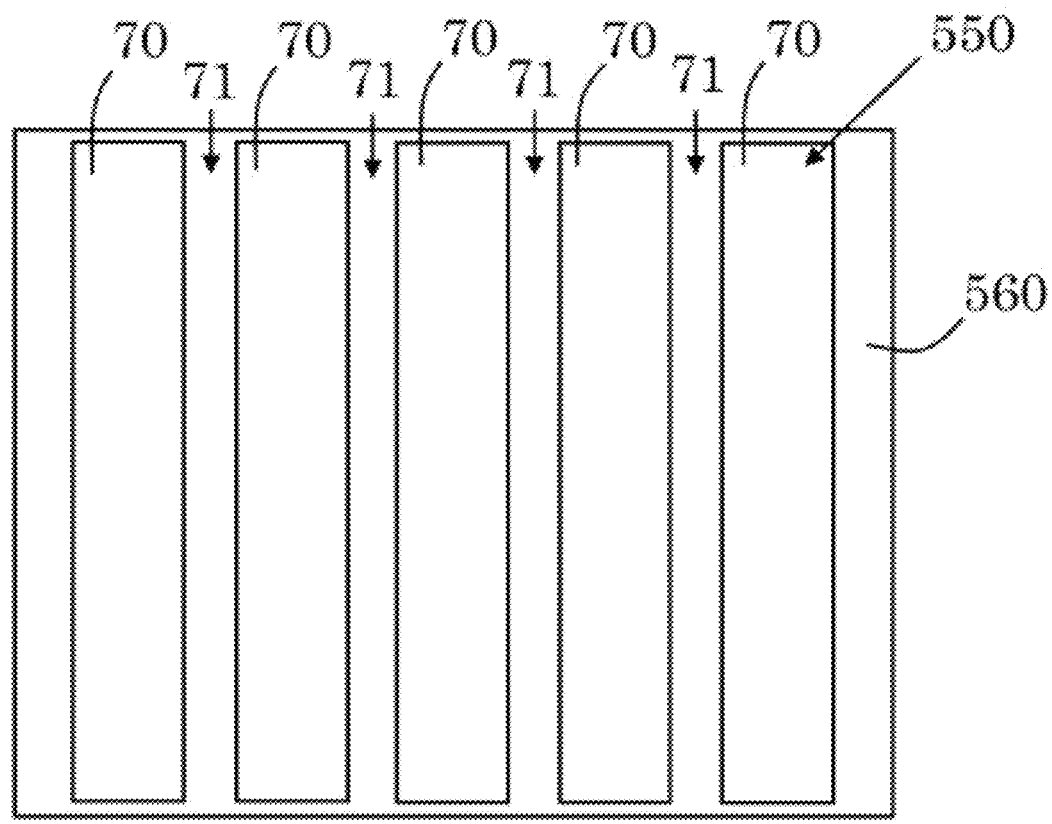
FIG. 13 shows a schematic view of a substrate with elongated masks arranged in parallel on a surface of a substrate and used in an embodiment of a method for producing a crystalline film.
Figure 14:
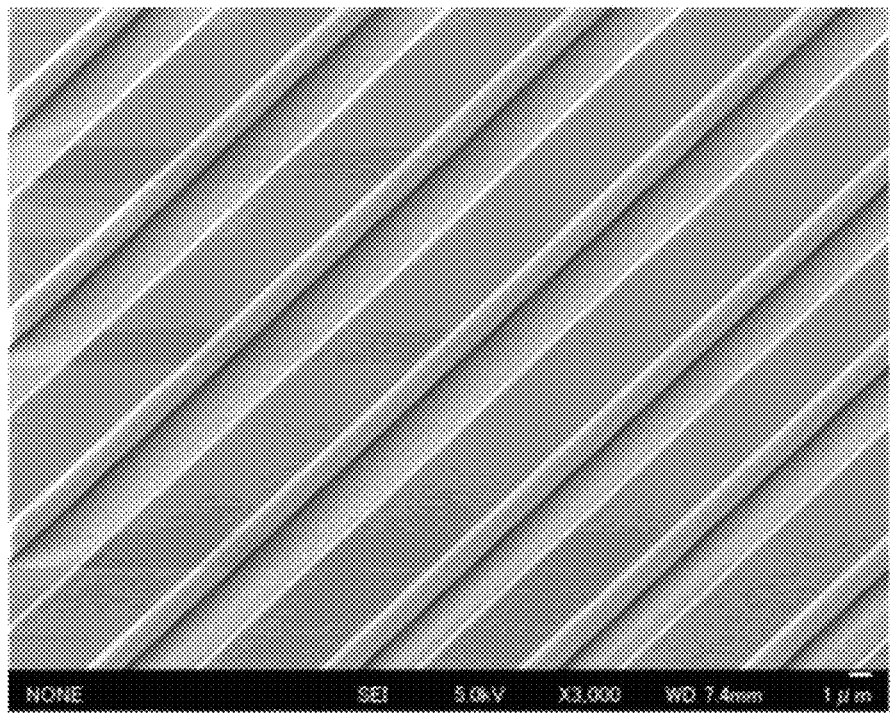
FIG. 14 is a photomicrograph showing a crystalline film with ridges grown on a surface of the substrate and elongated masks that are arranged to be stripe-patterned on the surface of the substrate, as shown in FIG. 13.

In embodiments of a present inventive subject matter, after gasifying a metal source to turn the metal source into a metal-containing raw-material gas, supplying the meal-containing raw-material gas and an oxygen-containing raw-material gas into a reaction chamber onto a substrate on that an uneven portion including at least one mask and two or more openings is arranged. The at least one mask of the uneven portion may be a sheet-shaped mask with openings arranged on a surface of a substrate. The openings may be arranged at a regular interval on the surface of the substrate. The openings 2b may be separated from one another by masks 2a as shown in FIG. 4. FIG. 5, FIG. 6A, FIG. 6B Also, the at least one mask of the uneven portion may include two or more elongated masks arranged in parallel with one of the two or more openings positioned between adjacently arranged two of the elongated masks, as shown in FIG. 13. The two or more elongated masks may be arranged at a regular interval on the surface of the substrate. FIG. 14 is a photomicrograph showing a crystalline film with ridges grown on the surface of the substrate and on elongated masks that are arranged to be stripe-patterned on the surface of the substrate, as shown in FIG. 13. Crystalline metal oxide grows vertically, laterally and/or radially on a surface of the substrate 560 through openings arranged in parallel to grow two or more islands of crystalline metal oxide vertically, laterally and/or radially through the two or more openings of the uneven portion on the substrate under a gas flow of the reactive gas. The two or more islands of the crystalline metal oxide further grow onto the masks and coalesce to form an epitaxial lateral overgrowth layer of the crystalline metal oxide.

Figure 15A:
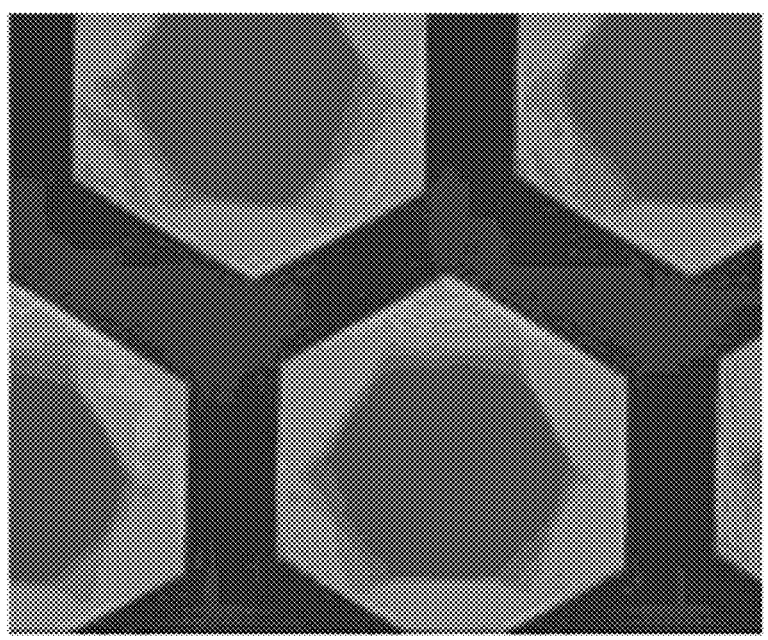
FIG. 15A is a photomicrograph taken from above, showing crystal growth of a crystalline metal oxide grown on a mask through two or more openings that are dotted on a surface of a substrate, as a reference example.

FIG. 15A is a photomicrograph taken from above, showing crystal growth of a crystalline metal oxide grown on a mask through two or more openings that are dotted on a surface of a substrate, as a reference example. Islands of crystalline metal oxide grow vertically, laterally and/or radially through the two or more openings, then islands of crystalline metal oxide further grow onto the mask to coalesce. The two or more openings each may have a shape of circle, triangle, a quadrangle, a pentagon and/or a hexagon in a plan view for example.

Figure 15B:
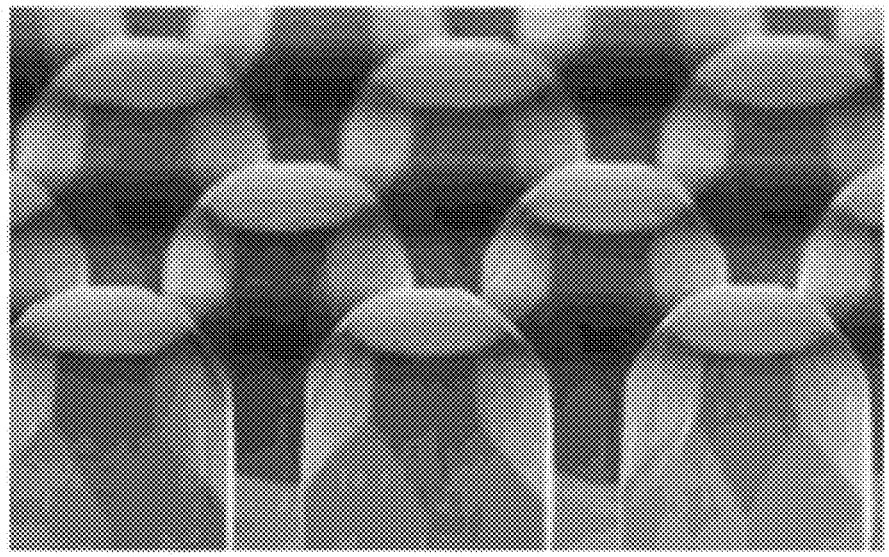
FIG. 15B is a photomicrograph taken from obliquely above, showing crystal growth of α-Ga$_2$O$_3$ film grown on a mask with two or more openings that are dotted on a surface of a substrate, as a reference example. Islands of crystalline metal oxide grow vertically, laterally and/or radially on the surface of the substrate through the two or more openings onto the mask.
Figure 16:
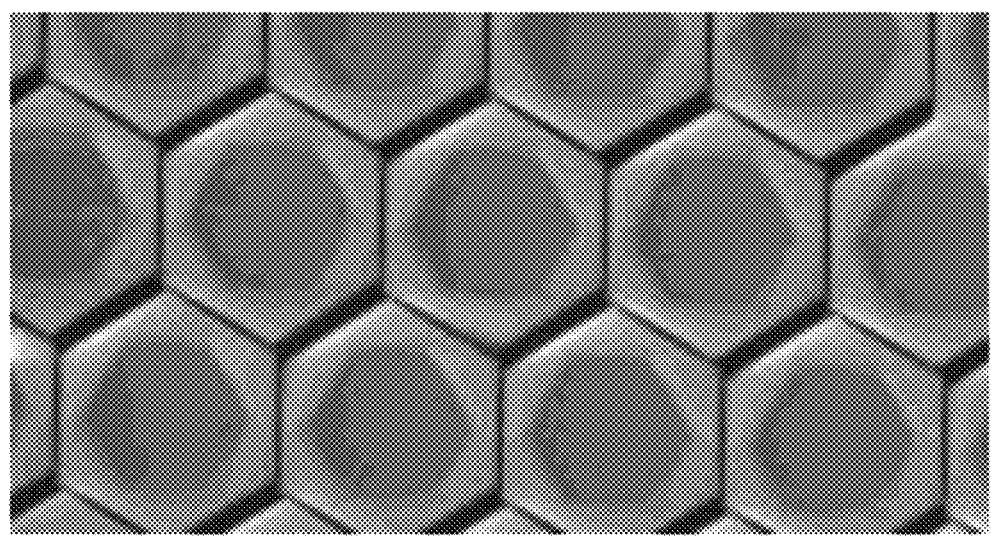
FIG. 16 is a photomicrograph taken from above, showing crystal growth of α-Ga$_2$O$_3$ further grown through two or more openings that pass through the mask and are arranged at a regular interval, as a reference example.

The term "islands of crystalline metal oxide" here indicates a process of crystal growth as shown in FIG. 15A to FIG. 16, for example, before the islands of crystalline metal oxide start to coalesce to form a crystalline film.

The two or more openings may be separated from one another by the two or more elongated masks. Also, the two or more openings may be connected at ends of the elongated masks, for example.

The substrate may have a corundum structure. Also, in embodiments of a present inventive subject matter, a reactive gas is supplied into the reaction chamber onto the substrate.

Examples of the oxygen-containing raw-material gas include oxygen ($O_2$) gas, carbon dioxide ($CO_2$) gas, nitric oxide (NO) gas, nitrogen dioxide ($NO_2$) gas, nitrous oxide ($N_2O$) gas, $H_2O$ gas and ozone ($O_3$) gas. In embodiments of a present inventive subject matter, the oxygen-containing raw-material gas is preferably at least one selected from among $O_2$ gas, $H_2O$ gas, and ($N_2O$) gas, and the oxygen-containing raw-material gas further preferably contains $O_2$ gas. According to an embodiment of a method for producing a crystalline film, the oxygen-containing raw-material gas may contain $CO_2$ gas. The reactive gas, usually different from the metal-containing raw-material gas and the oxygen-containing raw-material gas, excludes inert gas. The reactive gas is not particularly limited as long as an object of a present inventive subject matter is not interfered with, however, an etching gas is named as an example. The etching gas is not particularly limited as long as an object of a present inventive subject matter is not interfered with and may be a known etching gas. In embodiments of a method for producing a crystalline film, the reactive gas is preferably a halogen gas, a hydrogen halide gas, and/or a hydrogen gas. Examples of the halogen gas include a fluorine gas, a chlorine gas, bromine gas, and iodine gas. Examples of the hydrogen halide gas include a hydrofluoric acid gas, a hydrochloric acid gas, a hydrogen bromide gas, and a hydrogen iodide gas.

The reactive gas may be a mixed gas containing two or more gasses mentioned above, and the reactive gas preferably contains a hydrogen halide gas and most preferably contains hydrogen chloride.

Also, the metal-containing raw-material gas, the oxygen-containing raw-material gas, and the reactive gas may contain a carrier gas, respectively. The carrier gas may be an inert gas, as an example. Examples of the inert gas include nitrogen and argon.

Furthermore, a partial pressure of the metal-containing raw-material gas is not particularly limited but in embodiments of a method of a present inventive subject matter, the partial pressure of the metal-containing raw-material gas is preferably in a range of 0.5 Pa to 1 kPa, and further preferably in a range of 5 Pa to 0.5 kPa. Also, a partial pressure of the oxygen-containing raw-material gas is not particularly limited but in embodiments of a method of a present inventive subject matter, the partial pressure of the oxygen-containing raw-material gas is preferably in a range of 0.5 times to 100 times of the partial pressure of the metal-containing raw-material gas, and further preferably in a range of 1 to 20 times of the partial pressure of the metal-containing raw-material gas. In addition, a partial pressure of the reactive gas is not particularly limited but in embodiments of a method of a present inventive subject matter, the partial pressure of the reactive gas is preferably in a range of 0.1 times to 5 times of the partial pressure of the metal-containing raw-material gas, and further preferably in a range of 0.2 times to 3 times.

In embodiments of a method of a present inventive subject matter, a dopant-containing raw-material gas is further preferably supplied into the reaction chamber onto the substrate. The dopant-containing raw-material gas is not particularly limited as long as the dopant-containing raw-material gas contains a dopant. The dopant is also not particularly limited but in embodiments of a method of a present inventive subject matter, the dopant may contain one or more elements selected from among germanium, silicon, titanium, zirconium, vanadium, niobium, and tin. According to an embodiment of a present inventive subject matter, the dopant preferably contains germanium, silicon and/or tin, and most preferably contains germanium. By using the dopant-containing raw-material gas in the method for producing a crystalline film, it is possible to easily control electrical conductivity of the crystalline film to be obtained. The dopant-containing raw-material gas preferably contains a dopant in the form of compound. Examples of the dopant in the form of compound include a halide and an oxide. The dopant-containing raw-material gas further preferably contains a halide as a dopant. A partial pressure of the dopant-containing raw-material gas is not particularly limited but in embodiments of a method of a present inventive subject matter, the partial pressure of the dopant-containing raw-material gas is preferably in a range of $1 \times 10^{-7}$ times to 0.1 times, and further preferably in a range of $2.5 \times 10^{-6}$ times to $7.5 \times 10^{-2}$ times. Furthermore, in embodiments of a method of a present inventive subject matter, the dopant-containing raw-material gas is preferably supplied with the reactive gas into the reaction chamber onto the substrate.

(Substrate)

The substrate is not particularly limited as long as the substrate includes an uneven portion on a surface of the substrate and is able to support a crystalline film to be grown on the substrate. The uneven portion on the surface of the substrate may include at least one mask and/or at least one opening. The substrate may be a known substrate. The substrate may be an electrically-insulating substrate. The substrate may be an electrically-conductive substrate. Also, the substrate may be a semiconductor substrate. In embodiments of a method for producing a crystalline film of a present inventive subject matter, the substrate is preferably a crystalline substrate.

(Crystalline Substrate)

The crystalline substrate is not particularly limited as long as the substrate contains a crystal as a major component and may be a known substrate. The crystalline substrate may be an electrically-insulating substrate. Also, the crystalline substrate may be a semiconductor substrate. The crystalline substrate may be a monocrystalline substrate. Also, the crystalline substrate may be a polycrystalline substrate. Examples of the crystalline substrate include a substrate containing a corundum-structured crystal as a major component, a substrate containing a β-gallia-structured crystal as a major component, and a hexagonal-structured substrate. The term "major component" herein means that a composition ratio of the crystal in the crystalline substrate is 50% or more, preferably 70% or more, and further preferably 90% or more.

Examples of the substrate containing a corundum-structured crystal as a major component include a sapphire ($\alpha$-$Al_2O_3$) substrate and an a-phase gallium oxide ($\alpha$-$Ga_2O_3$) substrate. Examples of the substrate containing a β-gallia-structured crystal as a major component include β-phase gallium oxide (β-$Ga_2O_3$) substrate and a substrate containing a mixed crystal of β-$Ga_2O_3$ and $\alpha$-$Al_2O_3$. As a substrate containing the mixed crystal of β-$Ga_2O_3$ and $\alpha$-$Al_2O_3$, the substrate of the mixed crystal in which $Al_2O_3$ is contained in a range of more than 0% to 60% or less in terms of atomic ratio. Also, examples of the hexagonal-structured substrate include a silicon carbide (SiC) substrate, a zinc oxide (ZnO) substrate, a gallium nitride (GaN) substrate. An example of another crystalline substrate is a silicon (Si) substrate, for example.

In embodiments of a present inventive subject matter, the crystalline substrate is preferably a sapphire substrate. Examples of the sapphire substrate include a c-plane sapphire substrate, an m-plane sapphire substrate and an a-plane sapphire substrate. The sapphire substrate may include an off-angle. The off-angle of the sapphire substrate is not particularly limited, however, preferably in a range of 0° to 15°. Also, the thickness of the crystalline substrate is not particularly limited, however preferably in a range of 50 μm to 2000 μm, and further preferably in a range of 200 μm to 800 μm.

Figure 3:
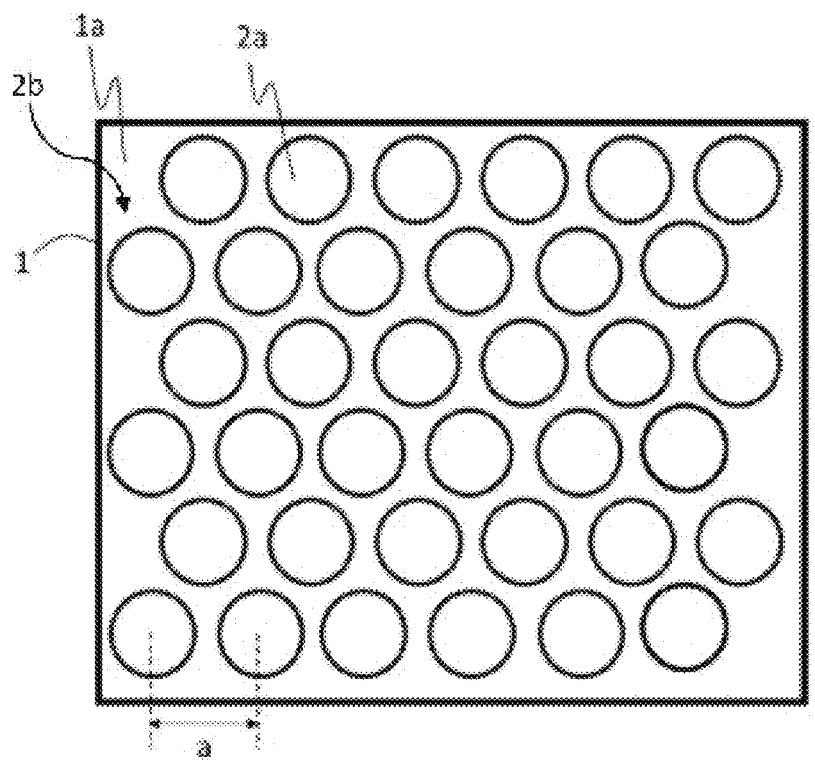
FIG. 3 shows a schematic top plan view of a substrate with an uneven portion formed on a surface of the substrate according to a present inventive subject matter as an example.

In embodiments of a present inventive subject matter, since the substrate includes an uneven portion that includes at least one mask and/or two or more openings, it is possible to produce a crystalline film efficiently. The uneven portion of the substrate is not particularly limited as long as the uneven portion of the substrate includes at least one selected from among a mask and an opening. The uneven portion of the substrate may be two or more masks. Also, the uneven portion of the substrate may be two or more openings. Furthermore, the uneven portion of the substrate may be a combination of a mask and an opening. The uneven portion of the substrate may include regularly arranged masks and/or openings. Also, the uneven portion of the substrate may include irregularly arranged masks and/or openings. In embodiments of a present inventive subject matter, the masks and/or the openings of the uneven portion are arranged at a regular interval. The regular interval may be set as a distance between a center of a first mask and a center of a second mask that is positioned adjacent to the first mask or a distance between a center of a first opening and a center of a second opening that is positioned adjacent to the first opening, for example. In embodiments of a present inventive subject matter, the masks and/or the openings of the uneven portion are preferably arranged regularly and repeatedly as a regular pattern. Examples of the regular pattern of mask include a striped pattern, a dot pattern, and a lattice pattern. In embodiments of a present inventive subject matter, the masks and/or the openings of the uneven portion are preferably arranged in a striped pattern or in a dot pattern, and further preferably arranged in a dot pattern. The masks and/or the openings each in the shape of polygon in a plan view may be arranged. Examples of the polygon include a triangle, a quadrangle, a pentagon, and a hexagon in a plan view. Also, examples of the quadrangle include a square, a rectangle and a trapezoid. Furthermore, the masks and/or the openings may be regularly and repeatedly arranged as a pattern. Examples of the mask of the uneven portion appear to be circles arranged in a grid pattern at a regular interval in a top plan view as shown in FIG. 3, regular squares, triangles at a regular interval in a top plan view as shown in FIG. 5.

Material component of the at least one mask is not particularly limited and may be a known material component. The mask of the uneven portion may be electrically-insulating. Also, the mask of the uneven portion may be electrically conductive. The mask of the uneven portion may be semi-conductive. The material component of the mask of the uneven portion may be amorphous. The material component of the mask of the uneven portion may be monocrystalline. Also, the material component of the mask of the uneven portion may be polycrystalline. Examples of the material component of the mask of the uneven portion include an oxide, a nitride, a carbide, carbon, diamond, a metal, and a mixture of at least two selected from among an oxide, a nitride, a carbide, carbon, diamond, and a metal. Examples of the oxide include silicon (Si) oxide, germanium (Ge) oxide, titanium (Ti) oxide, zirconium (Zr) oxide, hafnium (Hf) oxide, tantalum (Ta) oxide, and tin (Sn) oxide. More specifically, the material component of the mask of the uneven portion may be silicon-containing compounds containing at least one selected from among $SiO_2$, SiN and polycrystalline silicon as a major component, and a metal having a melting point higher than a crystal growth temperature of a crystalline film that is a crystalline oxide semiconductor film. Examples of the metal having the melting point higher than the crystal growth temperature of the crystalline film include platinum, gold, silver, palladium, rhodium, iridium, and ruthenium. Also, the major component of the mask of the uneven portion accounts for 50% or more at a composition ratio, preferably 70% or more, and most preferably 90% or more.

The mask of the uneven portion may be formed by a known method. Examples of the known method include photolithography, electron beam lithography, laser patterning, and etching such as dry etching and wet etching. In embodiments of a present inventive subject matter, elongated masks are preferably arranged in parallel, and masks are further preferably arranged in a grid pattern at a regular interval. In embodiments of a method for producing a crystalline film of a present inventive subject matter, the crystalline substrate is preferably a patterned sapphire substrate (PSS). Shapes of the masks of the uneven portion can be formed as a pattern. The shapes of the pattern include circular cones, hemispherical shapes, dome shapes, quadrangular prisms, and quadrangular pyramids. Also, the distance between each shape of the masks is not particularly limited, however, in embodiments of a present inventive subject matter, the distance is preferably 5 μm or less, and further preferably in a range of 1 μm to 3 μm.

The opening of the uneven portion is not particularly limited, and in the opening a surface of a substrate may be exposed. A surface in the opening of the uneven portion may contain the same or similar material components to the material components of the mask. Also, according to embodiments of a present inventive subject matter, the opening of the uneven portion is preferably an opening positioned on a surface of a substrate. Also, according to embodiments of a present inventive subject matter, the opening of the uneven portion is just a surface of a substrate. Furthermore, according to an embodiment of a present inventive subject matter, the opening of the uneven portion may be a pass-through hole formed in a mask. Also, according to an embodiment of a present inventive subject matter, the opening of the uneven portion may be a recessed portion formed in a surface of the substrate. The opening may be formed by a known method. Also, the same and similar techniques to the known method of the mask mentioned above including photolithography, electron beam lithography, laser irradiation, and etching such as dry etching and wet etching are applied to form the opening. The opening of the uneven portion may be a groove. The width and depth of the groove and the size of an upper surface of a flat portion exposed in the groove are not particularly limited, as long as an object of a present inventive subject matter is not interfered with. The flat portion surrounded by the groove may be a surface of the substrate or a mask. According to an embodiment of a present inventive subject matter, a crystalline film may include at least one mask with two or more openings. In the opening, air or an inert gas may be contained.

Figure 2:
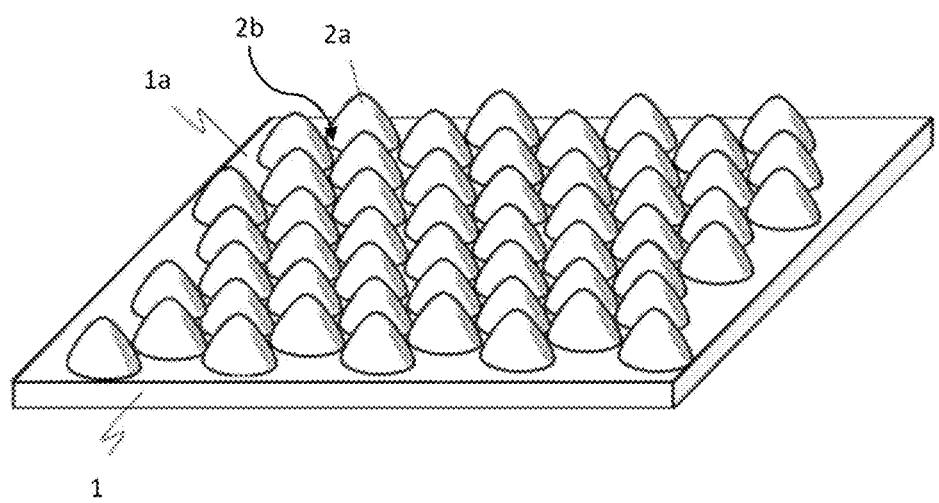
FIG. 2 shows a schematic perspective view of a substrate with an uneven portion formed on a surface of the substrate according to an embodiment of a present inventive subject matter as an example.

According to an embodiment of a method for producing a crystalline film of a present inventive subject matter, a substrate includes an uneven portion formed on a surface of the substrate as shown in FIG. 2. The uneven portion on the surface of the substrate in this embodiment are masks $2a$ arranged on the surface of the substrate 1. FIG. 3 shows a schematic top plan view of the substrate with the uneven portion formed on the surface $1a$ of the substrate 1. As shown in FIG. 2 and FIG. 3, the masks $2a$ are arranged with a regular interval "a". The regular interval "a" may be set as a distance between a center of a first mask and a center of a second mask that is positioned adjacent to the first mask. A plurality of masks $2a$ in this embodiment are spaced from one another and are separated from one another. The regular interval "a" is not particularly limited but in this embodiment, preferably is in a range of 0.5 μm to 10 μm. The regular interval "a" in this embodiment further is preferably in a range of 1 μm to 5 μm, and most preferably in a range of 1 μm to 3 μm. Examples of the shape of the mask $2a$ in this embodiment is a circular cone, and a hemispherical shape. The mask $2a$ may be formed by a photolithography, for example.

FIG. 4 shows a schematic perspective view of a substrate with an uneven portion formed on a surface of the substrate according to a present inventive subject matter as an example. FIG. 5 shows a top plan view of the substrate with the uneven portion formed on the surface of the substrate. The uneven portion of this embodiment has a shape different from the shape of the uneven portion shown in FIG. 2 and FIG. 3. The uneven portion shown in FIG. 4 are masks that are arranged on a surface of the substrate. The shape of the masks $2a$ in this embodiment is a triangular pyramid. The masks of triangular pyramids are arranged with a regular interval, which may be set as a regular distance "a" between a center of a first triangular pyramid and a center of a second triangular pyramid that is positioned adjacent to the first triangular pyramid. The triangular pyramids in this embodiment may be arranged in laterally and obliquely parallel as shown in FIG. 5. Also, two or more triangular pyramids may be in contact with adjacent triangular pyramids at apexes of the triangular pyramid. The regular interval "a" is not particularly limited but in this embodiment, preferably in a range of 0.5 μm to 10 μm. The regular interval in this embodiment further preferably in a range of 1 μm to 5 μm, and most preferably in a range of 1 μm to 3 μm. In this embodiment, the mask has a regular triangular shape in a plan view, and the opening has a regular triangular shape in a plan view.

FIG. 6A shows a schematic perspective view of a substrate with an uneven portion formed on a surface of the substrate according to a present inventive subject matter. FIG. 6B shows a schematic top plan view of a substrate with an uneven portion formed on a surface of the substrate shown in FIG. 6A.

The uneven portion of this embodiment is a sheet-shaped mask $2a$ with two or more openings $2b$ arranged on the surface of the substrate 1. In the openings $2b$ of the mask $2a$, the surface $1a$ of the substrate appears, as shown in FIG. 6A and FIG. 6B. In this embodiment, the mask $2a$ appears to be a lattice with triangular openings $2b$. Examples of the shape of openings $2b$ include circle, triangle, a quadrangle, a pentagon and/or a hexagon in a plan view.

The mask $2a$ may be made of the same material of the substrate. Also, the mask may be made of a silicon-containing compound, which may be $SiO_2$. Furthermore, the mask $2a$ may be formed by a photolithography, for example. The regular interval "a" may be set as a distance between a center of a first opening and a center of a second opening that is positioned adjacent to the first opening. The regular interval "a" is not particularly limited but in this embodiment, preferably in a range of 0.5 μm to 10 μm. The regular interval in this embodiment is further preferably in a range of 1 μm to 5 μm, and most preferably in a range of 1 μm to 3 μm.

Figure 7A:
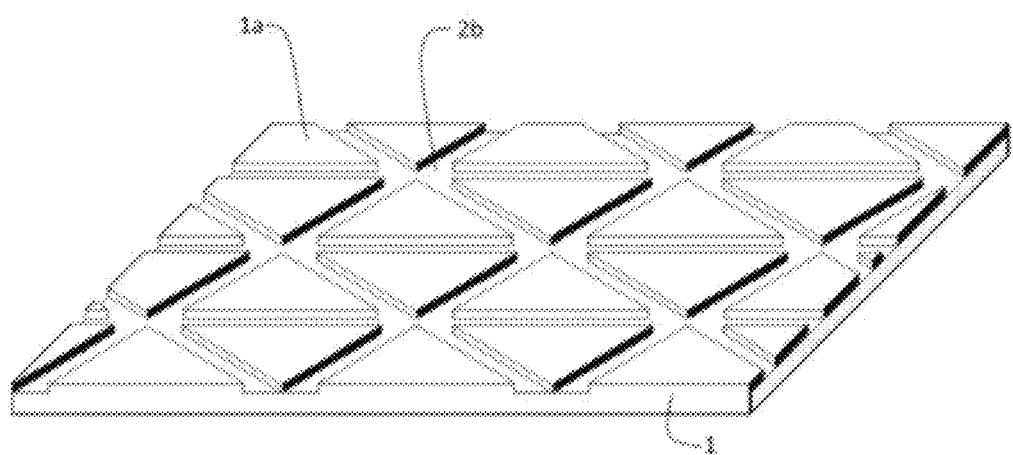
FIG. 7A shows a schematic perspective view of a substrate with an uneven portion formed on a surface of the substrate according to a present inventive subject matter as an example.

FIG. 7A shows a schematic perspective view of a substrate with an uneven portion formed on a surface of the substrate according to a present inventive subject matter as an example. In this embodiment, the opening is a recessed portion formed in the substrate 1.

Figure 7B:
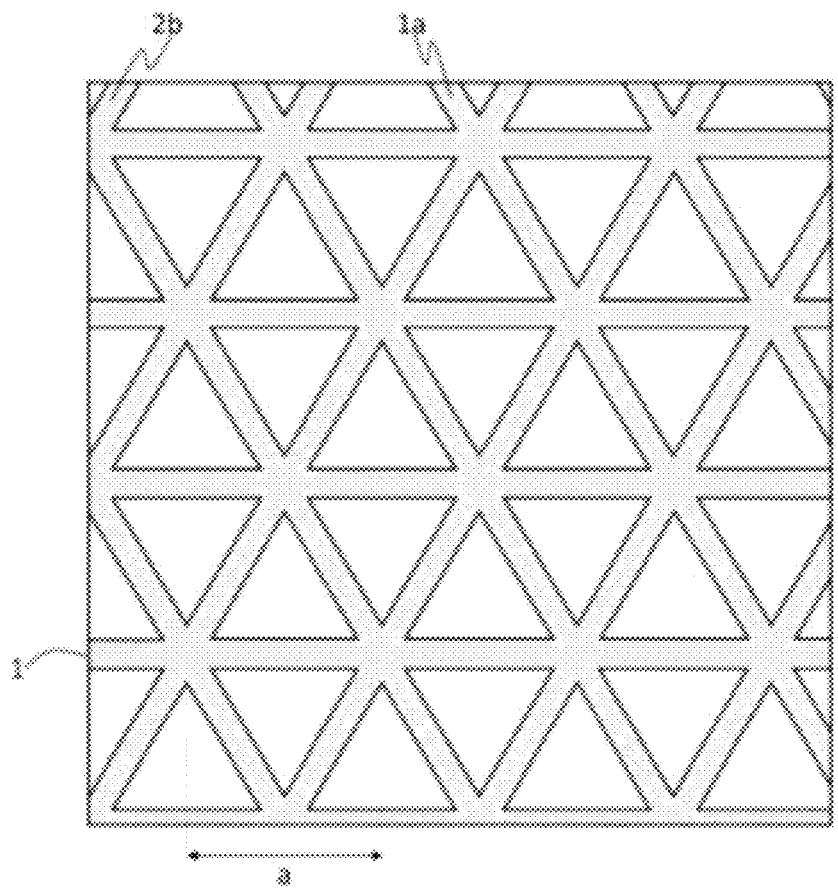
FIG. 7B shows a schematic top plan view of a substrate with an uneven portion formed on a surface of the substrate according to a present inventive subject matter as an example.

FIG. 7B shows a schematic top plan view of a substrate with an uneven portion formed on a surface of the substrate according to a present inventive subject matter as an example. The uneven portion of the substrate in this embodiment is an opening 2b surrounding triangular shapes of an upper surface of the substrate. The opening 2b may be formed by laser irradiation, for example. The triangular openings in this embodiment may be connected with adjacent triangular openings at apexes of the triangular openings, and the apexes may be set as the regular interval a. The regular interval a is not particularly limited but in this embodiment, preferably in a range of 0.5 μm to 10 μm. The regular interval in this embodiment is further preferably in a range of 1 μm to 5 μm.

The opening of the uneven portion may be a groove. The width and depth of the groove and the size of an upper surface of the substrate surrounded by the groove are not particularly limited, as long as an object of a present inventive subject matter is not interfered with. The flat portion surrounded by the groove may be a raised portion or a mask. According to an embodiment of a present inventive subject matter, a crystalline film may include an uneven portion including at least one mask and at least one opening. The at least one mask may include a plurality of masks. Also, the at least one opening may include a plurality of openings. The distance between adjacent masks and/or between adjacent openings is not particularly limited, however, according to an embodiment of a present inventive subject matter, the distance may be in a range of 10 nm to 1 mm, for example. In some embodiments of a present inventive subject matter, the distance between adjacent masks and/or between adjacent openings is preferably in a range of 10 nm to 300 μm, further preferably in a range of 10 nm to 1 μm, and most preferably in a range of 100 nm to 1 μm.

Furthermore, according to an embodiment of a method for producing a crystalline film of a present inventive subject matter, the at least one mask and the at least one opening of the uneven portion includes a sheet-shaped mask including two or more openings that are arranged at a regular interval that is in a range of 3 μm or more to 100 μm or less.

Also, according to an embodiment of a method for producing a crystalline film of a present inventive subject matter, at least one mask of an uneven portion includes dot-patterned masks that are arranged at a regular interval that is in a range of 3 μm or more to 100 μm or less.

According to an embodiment of a present inventive subject matter, the substrate may include a buffer layer on top of the substrate. Also, if the substrate includes a buffer layer, the buffer layer on the substrate may include an uneven portion on a surface of the buffer layer. The uneven portion may include at least one mask and at least one opening. The buffer layer may include the uneven portion on an entire surface of the buffer layer. Examples of the method to form a buffer layer includes a spraying method, a mist chemical vapor deposition (CVD) method, a Halide Vapor Phase Epitaxy (HVPE) method, a Molecular Beam Epitaxy (MBE) method, a Metalorganic Chemical Vapor Deposition (MOCVD) method, and a sputtering method. The buffer layer may be formed by a known method. In embodiments of a method for producing a crystalline film of a present inventive subject matter, the buffer layer is preferably formed by use of a mist CVD method, which is able to enhance quality of a crystalline film to be formed on the buffer layer with the uneven portion. The buffer layer formed by the mist CVD method on the substrate is useful to suppress occurrence of tilt that is included in a crystal defect. Embodiments of a method for producing a crystalline film on a buffer layer that is formed by use of a mist CVD method are explained in details as follows.

According to an embodiment to form a buffer layer by use of a mist CVD method, a buffer layer is preferably formed by turning a raw-material solution into atomized droplets, carrying the atomized droplets by use of a carrier gas onto a substrate, and adjusting the temperature of air and/or the substrate to cause thermal reaction of the atomized droplets adjacent to the substrate to form the buffer layer on the substrate.

(Forming Atomized Droplets From a Raw Material Solution)

A raw material solution is turned into atomized droplets floating in a space of a container of a mist generator. The raw material solution may be turned into atomized droplets by a known method, and the method is not particularly limited, however, according to an embodiment of a present inventive subject matter, the raw material solution is preferably turned into atomized droplets by ultrasonic vibration. Atomized droplets including mist particles and obtained by using ultrasonic vibration and floating in the space have the initial velocity that is zero. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of atomized droplets is preferably 50 μm or less. The size of droplets is preferably in a range of 0.1 μm to 10 μm.

(Raw-Material Solution)

The raw-material solution is not particularly limited as long as a buffer layer is able to be formed from the raw-material solution by a mist CVD method. Examples of the raw-material solution include a solution of organometallic complex of a metal, and a solution of halide. Examples of the solution of organometallic complex include a solution of acetylacetonate complex. Examples of the solution of halide include a solution of fluoride, a solution of chloride, a solution of bromide and a solution of iodide. Examples of the metal of organometallic complex include gallium, indium, and/or aluminum. According to an embodiment of a present inventive subject matter, the metal of organometallic complex preferably contains at least gallium. The amount of metal contained in the raw material solution is not particularly limited as long as an object of the present inventive subject matter is not interfered with, however, the amount of metal contained in the raw material solution is preferably 0.001 mol % to 50 mol %. The amount of metal contained in the raw material solution is further preferably 0.01 mol % to 50 mol %.

Also, according to an embodiment of a present inventive subject matter, a raw material solution may contain a dopant. By introducing a dopant into a raw material solution, it is possible to control electrical conductivity of a crystalline layer or a crystalline film, without ion implantation, for example, and thus, it is possible to form a semiconductor layer without breaking a crystalline structure of the semiconductor layer. Accordingly, this method is able to be used to form a crystalline film as a semiconductor layer or a semiconductor film. Examples of n-type dopant include tin, germanium, silicon and lead. The n-type dopant is preferably tin or germanium, and most preferably tin. Examples of p-type dopant include magnesium, calcium, and zinc. The dopant concentration in general may be in a range of $1 \times 10^{16}/cm^3$ to $1 \times 10^{22}/cm^3$. The dopant concentration may be at a lower concentration of, for example, approximately $1 \times 10^{17}/cm^3$ or less, also the dopant concentration may be at a high concentration of, for example, $1 \times 10^{20}/cm^3$ or more. According to embodiments of a present inventive subject matter, the dopant concentration is preferably $1 \times 10^{20}/cm^3$ or less, and further preferably $5 \times 10^{19}/cm^3$ or less.

According to an embodiment of a present inventive subject matter, a solvent of the raw material solution is not particularly limited and may be an inorganic solvent including water. Also, according to an embodiment, a solvent of the raw material solution may be an organic solvent including alcohol. Furthermore, according to an embodiment of a present inventive subject matter, a mixed solvent of water and alcohol may be used. According to embodiments of a present inventive subject matter, a solvent of the raw material solution preferably contains water, and a mixed solvent of water and alcohol is further preferably used, and most preferably, a solvent of the raw material solution is water, which may include, for example, pure water, ultrapure water, tap water, well water, mineral water, hot spring water, spring water, fresh water and ocean water. According to embodiments of a present inventive subject matter, ultrapure water is preferable as a solvent of a raw material solution.

(Carrying Atomized Droplets Into a Film-Formation Chamber)

Atomized droplets floating in the space of a container for forming atomized droplets are carried into a film-formation chamber by a carrier gas. The carrier gas is not limited as long as an object of the present inventive subject matter is not interfered with, and thus, examples of the carrier gas may be an inert gas such as nitrogen and argon, may be an oxidizing gas such as oxygen and ozone, and may be a reducing gas such as a hydrogen gas and a forming gas. One or more carrier gas of the examples may be used, and a dilution gas at a reduced flow rate (e.g., 10-fold dilution gas) may be used as a second carrier gas. Also, the carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 1 to 10 L/min. When a dilution gas is used, the flow rate of the dilution gas is preferably in a range of 0.001 to 2 L/min, and further preferably in a range of 0.1 to 1 L/min.

(Forming a Buffer Layer)

For forming a buffer layer, the atomized droplets carried into the film-formation chamber by carrier gas are thermally reacted (through "thermal reaction") to form a buffer layer on a surface of a substrate. Herein, "thermal reaction" covers as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a present inventive subject matter, the thermal reaction is conducted at an evaporation temperature or higher temperatures of the evaporation temperature of the solvent of the raw material solution, however, the temperature range for the "thermal reaction" is not too high and may be below 1000° C., for example. The thermal reaction is preferably conducted at a temperature below 650° C., and most preferably conducted at a temperature in a range of 400° C. to 650° C. Also, the thermal reaction may be conducted in any atmosphere of a vacuum, a non-oxygen atmosphere, a reducing-gas atmosphere, and an oxidizing-gas atmosphere. Also, the thermal reaction may be conducted in any condition of under an atmospheric pressure, under an increased pressure, and under a reduced pressure, however, according to embodiments of a present inventive subject matter, the thermal reaction is preferably conducted under an atmospheric pressure. Also, the thickness of the buffer layer is able to be set by adjusting a film-formation time.

As mentioned above, a buffer layer may be formed on at least a part of a surface of the substrate. It is also possible to form a buffer layer on an entire surface of the substrate. A crystalline film formed on the buffer layer that is formed on the substrate is able to decrease crystal defects such as tilts. Accordingly, it is possible to obtain a crystalline film in good quality with less defects.

The buffer layer is not particularly limited, however, in embodiments of a present inventive subject matter, the buffer layer preferably contains a metal oxide as a major component. Examples of the metal oxide include aluminum (Al) oxide, gallium (Ga) oxide, indium (In) oxide, iron (Fe) oxide, chromium (Cr) oxide, vanadium (V) oxide, titanium (Ti) oxide, rhodium (Rh) oxide, nickel (Ni) oxide, cobalt (Co) oxide, and iridium (Ir) oxide, and at least one of the examples of the metal oxide may be contained in the buffer layer as a major component. Of course, an oxide of a combination of two or more metals selected from among Al, Ga, In, Fe, Cr, V, Ti, Rh, Ni, Co, and Ir may be contained in the buffer layer as a major component. In embodiments of a present inventive subject matter, a buffer layer preferably contains at least one selected from among In, Al, and Ga as a major component. In an embodiment of a present inventive subject matter, a buffer layer further preferably contains In and/or Ga, and most preferably contains at least Ga. As an embodiment of a method for producing a crystalline film of a present inventive subject matter, a buffer layer may contain a metal oxide as a major component, and the metal oxide contains gallium and aluminum that is less in quantity than gallium contained in the metal oxide of the crystalline film. Also, according to an embodiment of a method for producing a crystalline film of a present inventive subject matter, a buffer layer may include a superlattice structure. In embodiments of a present inventive subject matter, the term "major component" herein means that a metal oxide as a major component accounts for 50% or more of entire components contained in the buffer layer at atomic ratio. In an embodiment of a present inventive subject matter, a buffer layer further preferably contains a metal oxide as a major component that accounts for 70% or more, and more preferably 90% or more of entire components contained in the buffer layer. This means that the metal oxide may account for 100% of a buffer layer.

The crystalline structure of a crystalline film is not particularly limited but in embodiments of a present inventive subject matter, the crystalline film preferably has a corundum structure and/or a β-gallia structure. The crystalline film further preferably has a corundum structure. The major component of the crystalline film may be different from the major component of the buffer layer as long as an object of a present inventive subject matter is not interfered with, however, according to embodiments of the present inventive subject matter, the crystalline film preferably contains a metal oxide as a major component that is the same as the metal oxide as a major component of the buffer layer.

In an embodiment of a method for producing a crystalline film, the method includes supplying a metal-containing raw-material gas, an oxygen-containing raw-material gas, and a reactive gas onto a substrate. The substrate may include a buffer layer on top of the substrate. Also, if desired, the method may include supplying a dopant-containing raw-material gas in addition to supplying the metal-containing raw-material gas, the oxygen-containing raw-material gas, and the reactive gas. In this embodiment, a crystalline film containing a metal oxide as a major component is formed under a gas flow of the reactive gas. It is preferable that the crystalline film is formed on the substrate that is heated or on the buffer layer on the substrate that is heated. The film-formation temperature is not particularly limited as long as an object of a present inventive subject matter is not interfered with, however, in embodiments of the method of a present inventive subject matter, the film-forming temperature is preferably 900° C. or less. The film-forming temperature is further preferably 700° C. or less, and most preferably in a range of 400° C. to 700° C. Also, the film formation may be conducted in any atmosphere of a vacuum, a non-vacuum environment, a reducing-gas atmosphere, an inert gas atmosphere and an oxidizing-gas atmosphere. Also, the film formation may be conducted in any condition of under an atmospheric pressure, under an increased pressure, and under a reduced pressure. According to embodiments of a present inventive subject matter, the film formation is preferably conducted under an atmospheric pressure. Also, a film thickness of crystalline oxide semiconductor film is able to be set by adjusting a film-formation time.

According to embodiments of a crystalline film of a present inventive subject matter, the crystalline film contains a crystalline metal oxide as a major component. Examples of the crystalline metal oxide include Al oxide, Ga oxide, In oxide, Fe oxide, Cr oxide, V oxide, Ti oxide, Rh oxide, Ni oxide, Co oxide, and Ir oxide. Of course, an oxide of a combination of two or more metals selected from among Al, Ga, In, Fe, Cr, V, Ti, Rh, Ni, Co, and Ir may be contained in the crystalline film as a major component. In embodiments of a present inventive subject matter, a crystalline film preferably contains at least one selected from among In, Al, and Ga as a major component. In an embodiment of a present inventive subject matter, a crystalline film further preferably contains In and/or Ga. The crystalline film most preferably contains a crystalline gallium oxide as a major component or a mixed crystal of gallium oxide as a major component, according to embodiments of a crystalline film of a present inventive subject matter. In embodiments of a crystalline film of a present inventive subject matter, the term "major component" herein means that a crystalline metal oxide as a major component accounts for 50% or more of entire components contained in the crystalline film at atomic ratio. In an embodiment of a present inventive subject matter, a crystalline film further preferably contains a metal oxide as a major component that accounts for 70% or more, and more preferably 90% or more of entire components contained in the crystalline film at atomic ratio. This means that the metal oxide may account for 100% of a crystalline film. The crystalline structure of a crystalline film is not particularly limited but in embodiments of a present inventive subject matter, the crystalline film preferably has a corundum structure and/or a β-gallia structure. The crystalline film further preferably has a corundum structure. The crystalline film is most preferably a crystal growth film including a corundum structure. The crystalline metal oxide contained in the crystalline film may be monocrystalline. Also, the crystalline metal oxide contained in the crystalline film may be polycrystalline. In an embodiment of a crystalline film of a present inventive subject matter, the crystalline metal oxide is preferably monocrystalline. The film thickness of the crystalline film is not particularly limited but the film thickness of the crystalline film is preferably 3 μm or more. Further preferably, the crystalline film is 10 μm or more in thickness, and most preferably 20 μm or more.

According to an embodiment of a method for producing a crystalline film of a present inventive subject matter, the method includes preparing a substrate that includes a crystalline oxide with a corundum structure and an uneven portion on at least a part of a surface of the substrate, forming a first crystalline film on the uneven portion of the substrate, forming an uneven portion on at least a part of a surface of the first crystalline film, and forming a second crystalline film on the uneven portion of the first crystalline film. The uneven portion include at least one mask and/or at least one opening.

The masks of the uneven portion may be masks, which is able to be formed like a pattern by a known technique. Also, the openings of the uneven portion may be grooves, which may be formed by a laser irradiation, for example. The first crystalline film is not particularly limited but the first crystalline film in this embodiment contains a crystalline oxide as a major component that is preferably different from a crystalline oxide contained in the substrate as a major component. The second crystalline film may contain a crystalline oxide as a major component that is different from the crystalline oxide contained in the first crystalline film, and also, the second crystalline film may contain a crystalline oxide as a major component that is the same as the crystalline oxide contained in the first crystalline film as a major component. The method or forming the second crystalline film is not particularly limited and may be a known method, and the second crystalline film may be obtained similarly by a method forming a first crystalline film and/or a buffer layer.

According to an embodiment of a present inventive subject matter, it is preferable to form the uneven portion of the first crystalline film to be separable from the second crystalline film, and the first crystalline film is able to be used as a sacrificial layer. To produce a sacrificial layer, a first crystalline film is formed, and an uneven portion is formed on at least a part of a surface of the first crystalline film. The uneven portion may be formed on an entire surface of the first crystalline film. An area and position of the uneven portion on the surface of the first crystalline film are suitably determined. The uneven portion may be masks and/or grooves, for example, and may be formed by a known method. According to embodiments of a present inventive subject matter, the uneven portion is preferable formed by arranging two or more metals, a metal compound, a nonmetal, a nonmetal compound, and/or a mixture of at least two of the two or more metals, the metal compound, the nonmetal and the nonmetal compound in shapes. The two or more metals are not particularly limited, but according to embodiments of a present invention, a precious metal is preferable. The metal compound is not particularly limited, and examples of the metal compound include a metal oxide, a metal nitride, and a metal sulfide, but according to an embodiment of a present inventive subject matter, the uneven portion is preferably formed by arranging a metal oxide in shapes. As an example of the metal oxide, a titanium oxide may be used. The nonmetal compound is not particularly limited, and examples of the nonmetal compound include a nonmetal oxide, a nonmetal nitride, and a nonmetal sulfide, but according to an embodiment of a present inventive subject matter, the uneven portion is preferably formed by arranging a nonmetal oxide in shapes. As an example of the nonmetal oxide, silicon dioxide may be used. Any shapes of the uneven portion are available as long as a second crystalline film is able to grow laterally. According to embodiments of a present inventive subject matter, masks and/or openings of the uneven portion are preferably regularly and repeatedly arranged as a pattern. According to embodiments of a present inventive subject matter, it is possible to obtain a crystalline film of an epitaxial lateral overgrowth of a metal oxide in good quality. For example, elongated shapes of masks may be arranged in parallel, according to an embodiment of a present inventive subject matter. Also, a mask having a shape of a triangular lattice with triangular openings may be arranged on a surface of the first crystalline film.

According to embodiments of a present inventive subject matter, a method for producing a crystalline film includes forming a second crystalline film on an uneven portion formed on at least a part of a surface of a first crystalline film. The uneven portion may be masks formed on the surface of the crystalline film. Also, the uneven portion may be recessed portions formed on the surface of the crystalline film. Furthermore, the uneven portion may be a combination of the mask and the opening. The first crystalline film including the uneven portion on a surface of the first crystalline film may be a crystalline film containing gallium oxide as a major component or a crystalline film containing a mixed crystal of gallium oxide as a major component.

According to an embodiment of a present inventive subject matter, the masks of the uneven portion are further preferably formed by arranging stripe patterned masks with opening spacing of 5-20 μm on a first crystalline film. The first crystalline film in this embodiment may be (0001) an α-Ga$_2$O$_3$ template or a sapphire template.

Also, according to an embodiment of a present inventive subject matter, the masks of the uneven portion are preferably formed by arranging triangular lattice patterned masks with triangular openings at a regular interval of 5-20 μm on a first crystalline film. The first crystalline film in this embodiment is (0001) an α-Ga$_2$O$_3$ template or a sapphire template.

In embodiments of a present inventive subject matter, it is preferable to form the uneven portion of the first crystalline film to be separable from the second crystalline film, and the first crystalline film is able to be used as a sacrificial layer. The uneven portion of the first crystalline film may be obtained by arranging two or more metals, a metal compound, and/or a nonmetallic compound in a shape of the uneven portion.

Also, according to an embodiment of a present inventive subject matter, it is possible to form a third crystalline film on an uneven portion formed on at least a part of a surface of the second crystalline film. The uneven portion on the surface of the second crystalline film may be obtained similarly to the uneven portion of the first crystalline film by arranging two or more metals, a metal compound, and/or a nonmetal compound in a shape of the uneven portion.

It is possible to increase the number of crystalline films by laterally overgrowing a crystal of an oxide of one or more metals to form a crystalline film on an uneven portion on a crystalline film previously grown.

Furthermore, an embodiment of a method for producing a crystalline film of a present inventive subject matter includes forming a first crystalline film of crystalline gallium oxide as a major component or a first crystalline film of a mixed crystal of gallium oxide as a major component, and forming a second crystal film of crystalline gallium oxide as a major component or a second crystalline film of a mixed crystal of gallium oxide as a major component on the first crystalline film. The first crystalline film may be used as a sacrificial layer.

Also, in this embodiment, the sacrificial film may include two or more layers. The two or more layers of the sacrificial film may include a metal layer, a metal compound layer, a nonmetal layer and/or a nonmetal compound layer in addition to a layer of crystalline gallium oxide as a major component and/or a layer of a mixed crystal of gallium oxide as a major component.

According to an embodiment of a present inventive subject matter, a crystalline film containing a corundum-structured crystalline metal oxide as a major component and with a dislocation density that is less than $5 \times 10^6$ cm$^{-2}$ and a surface area that is 9 μm$^2$ or more is obtainable. The term "dislocation density" herein means a dislocation density obtained by the number of dislocations per unit area observed by a TEM image. The TEM image may be a surface image. Also, the TEM image may be a cross-sectional TEM image.

A crystalline film obtained by a method for producing a crystalline film of an embodiment of a present inventive subject matter, is used for a semiconductor device including a power device. A power device using a crystalline film of a present inventive subject matter, for example, is expected to be a switching device achieving a high withstand voltage. Also, such a device is expected to obtain a high thermal resistance. Examples of the semiconductor device include a transistor such as a high-electron-mobility transistor (HEMT), a metal insulator semiconductor (MIS), a thin-film transistor (TFT), a semiconductor device, a Schottky barrier diode (SBD), a p-n junction diode, a PIN diode, a light-emitting element and a photodetector device. According to an embodiment of a present inventive subject matter, a crystalline film separated from a substrate may be used in a semiconductor device. Also, according to an embodiment of a present inventive subject matter, a crystalline film formed on the substrate may be used in a semiconductor device.

Embodiments are explained in more details.

EXAMPLE 1

1. Forming a Buffer Layer

Figure 8:
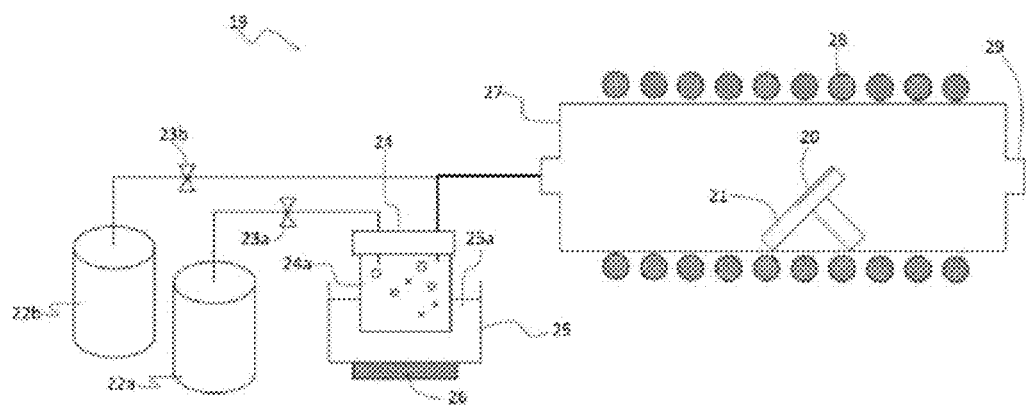
FIG. 8 shows a schematic view of a mist chemical vapor deposition (CVD) apparatus that is used in embodiments of a method for producing a crystalline film according to a present inventive subject matter.

As an embodiment of a method of forming a crystalline layer, a mist chemical vapor deposition (CVD) method may be used. FIG. 8 shows a mist CVD apparatus 19 used in this embodiment. The mist CVD apparatus 19 includes a mist generator 24 with a container, and a vessel 25 containing water 25a, and an ultrasonic transducer 26 attached to a bottom of the vessel 25. The mist CVD apparatus 19 further includes a carrier gas supply 22a, and a flow-control valve of carrier gas 23a. Furthermore, the mist CVD apparatus 19 may include a dilution carrier gas supply device 22b, and a flow-control valve of dilution carrier gas 23b. The mist CVD apparatus 19 includes a film-formation chamber 27 that may be a quartz tube with an inner diameter of 40 mm, a heater 28, and a stand 21 to support an object 20 in the film-formation chamber 27. The heater 28 may be arranged at a periphery of the film-formation chamber 27. A film is to be formed on the object, and the object may be a substrate. The stand 21 is made of quartz and includes a tilting surface, on which the object is placed. The tilting surface of the stand 21 may incline to a horizontal plane. The film-formation chamber 27 and the stage 21 both made of quarts tend to suppress entry of impurities originated from a material of parts and devices into a film to be formed on the object.

1-2. Preparation of Raw-Material Solution

A raw-material solution is prepared by mixing gallium bromide and tin bromide into ultrapure water such that tin to the atomic ratio of tin to gallium becomes 1:0.08 and gallium becomes 0.1 mol/L, and also, hydrobromic acid is contained in the raw material solution to be 20% in a volume ratio.

1-3. Film (Layer) Formation Preparation

The raw-material solution 24a obtained at 1-2. the Preparation of the Raw-Material Solution above was set in the container of the mist generator 24. Also, a patterned sapphire substrate (PSS) that is a c-plane sapphire substrate having an off-angle of 0.2° and an uneven portion that includes masks is placed in a film-formation chamber 27. The masks of the uneven portion are triangular pyramids with apexes arranged with a regular interval of 1 μm in a triangular lattice. The PSS was placed on the stand 21, and the heater was activated to raise the temperature of the film-formation chamber up to 460° C. The first flow-control valve 23a and the second flow-control valve 23b were opened to supply a carrier gas from the carrier gas device 22a and the diluted carrier gas device 22b, which are the source of carrier gas, into the film-formation chamber 27 to replace the atmosphere in the film-formation chamber 27 with the carrier gas sufficiently. After the atmosphere in the film-formation chamber 27 was sufficiently replaced with the carrier gas, the flow rate of the carrier gas from the carrier gas source 22a was regulated at 2.0 L/min. and the diluted carrier gas from the diluted carrier gas source 22b was regulated at 0.1 L/min. In this embodiment, nitrogen was used as the carrier gas.

1-4. Formation of a Film

The ultrasonic transducer 26 was then activated to vibrate at 2.4 MHz, and vibrations were propagated through the water 25a in the vessel to the raw material solution 24a to turn the raw material solution 24a into atomized droplets. The atomized droplets were introduced in the film-formation chamber 27 with the carrier gas. The film-formation chamber 27 was heated by the heater 28 up to 460° C. and the atomized droplets were thermally reacted in the film-formation chamber 27 to form a film on the object 20. The film that was obtained was used as a buffer layer. The film formation time was five minutes.

2. Formation of a Crystalline Film 2-1. HVPE Apparatus

With reference to FIG. 1, an HVPE apparatus that was used in this embodiment of a method for producing a crystalline film is described. The HVPE apparatus 50 includes a reaction chamber 51, a heater 52a to heat a metal source 57, and a heater 52b to heat an object that may be a substrate held by the substrate holder 56. The HYPE apparatus 50 further includes a supply tube 55b of oxygen-containing raw material gas, a supply gas tube 54b of reactive gas, and a substrate holder 56, on which the substrate is placed, in the reaction chamber 51. Furthermore, a supply tube 53b of metal-containing raw-material gas was arranged in the supply gas tube 54b of reactive gas to have a double-tube structure. The supply tube 55b of oxygen-containing raw material gas is connected to the supply device 55a of oxygen-containing raw material gas to form a flow path of the oxygen-containing raw material gas such that the oxygen-containing raw-material gas is supplied to the substrate held by the substrate holder 56. The supply tube 53b of metal-containing raw-material gas is connected to the supply device 53a of halogen-containing raw-material gas such that the halogen-containing raw-material gas is supplied to the metal source to form metal-containing raw-material gas. The metal-containing gas is then supplied onto the substrate held by the substrate holder 56. The reaction chamber 51 further includes a gas discharge portion 59 to discharge used gas and a protection sheet 58 arranged on an inner surface of the reaction chamber 51 to prevent reacted material from depositing on.

2-2 Film (Layer) Formation Preparation

A gallium (Ga) metal source 57 (99.99999% or higher purity) was arranged in the supply tube 53b of metal-containing raw-material gas, and the PSS substrate with the buffer layer (obtained at the above 1) on a surface of the PSS substrate was placed on the substrate holder 56 in the reaction chamber 51. After that the heater 52a and the heater 52b were activated to raise the temperature of the reaction chamber 51 up to 510° C.

3. Formation of a Film

Hydrogen chloride (HCl) gas (99.999% or higher purity) was supplied from the supply device 53a of halogen-containing raw-material gas to the Ga metal source 57 arranged in the supply tube 53b of metal-containing raw-material gas to form a gallium chloride (GaCl/GaCl$_3$) by a chemical reaction of Ga metal and HCl gas. The obtained gallium chloride (GaCl/GaCl$_3$) that is supplied through the supply tube 53b of metal-containing raw-material gas and O$_2$ gas (99.99995% or higher purity) that is supplied through the supply tube 55b of the supply device 55a of oxygen-containing raw material gas s are supplied onto the substrate. Under a gas flow of HCl (99.999% or higher purity), the gallium chloride (GaCl/GaCl$_3$) and O$_2$ gas were reacted at 510° C. under atmospheric pressure to form a crystalline film on the substrate. The film-formation time was 25 minutes. Here, a gas flow rate of HCl gas supplied from the supply device 53a of halogen-containing raw-material gas was maintained to be 10 sccm, a gas flow rate of the supply device 54a of reactive gas was maintained to be 5.0 sccm, and a gas flow rate of the supply device 55a of oxygen-containing raw material gas was maintained to be 20 sccm, respectively.

4. Evaluation

Figure 9:
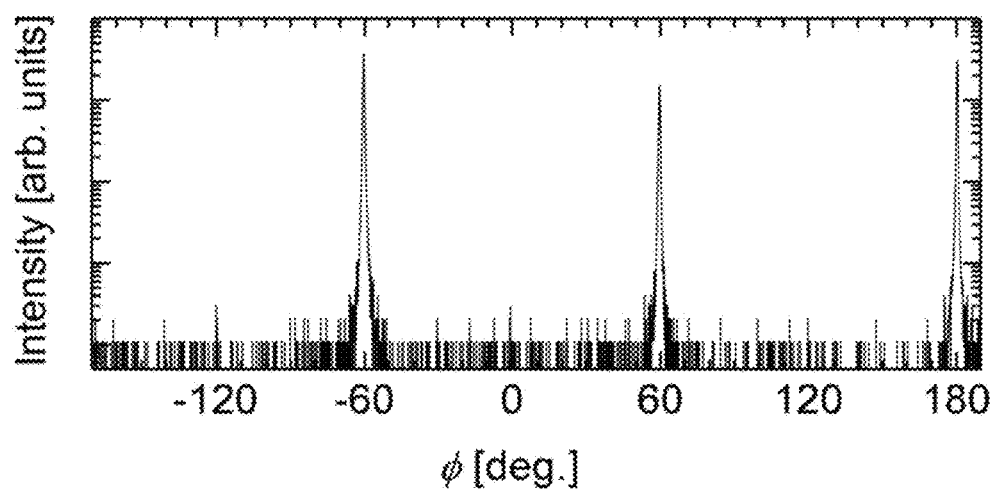
FIG. 9 shows an XRD φ-scan measurement result of a crystalline film according to an embodiment of a present inventive subject matter.

The film obtained at 3. was a crystalline film without a crack and abnormal growth, and characterized by use of the X-ray diffraction (XRD) analysis of XRD 2θ/ω scans at an angle from 15 degrees to 95 degrees. The measurement was conducted by use of CuKα radiation. The film obtained was found to be a film of α-Ga$_2$O$_3$. Also, FIG. 9 shows the result of XRD φ scan. As shown in FIG. 9, the film obtained at 3. was a crystalline film in good quality free from crystal twinning. The film was 10 μm in thickness. The film obtained at 3. had a surface area that is 9 μm$^2$ or more, and a dislocation density that is less than 5×10$^6$ cm$^{-2}$.

EXAMPLE 2

Figure 10:
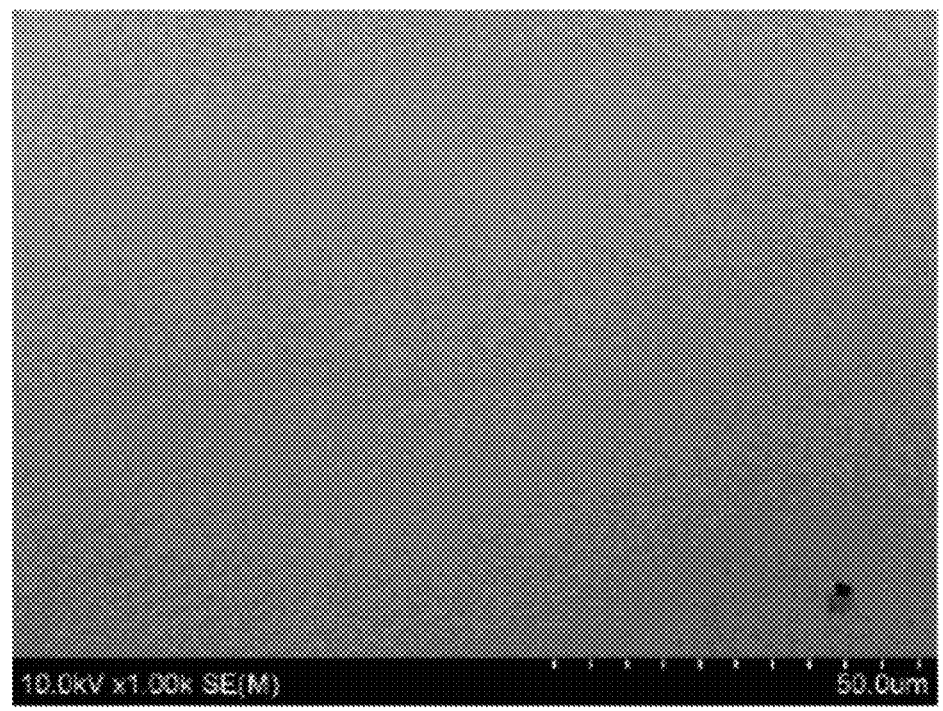
FIG. 10 shows a surface SEM image of a crystalline film according to Example 2 as an embodiment of a present inventive subject matter.

A crystalline film was obtained under the same conditions as the conditions of the Example 1 except the following two conditions: using a PSS substrate with a regular interval of 3 μm instead of using the PSS substrate with the buffer layer with a regular interval of 1 μm of Example 1, and the film-formation time of Example 2 was 75 minutes. The film obtained in Example 2 was characterized similarly to the case of Example 1 and found to be a crystalline film of α-Ga$_2$O$_3$ in good quality similarly to the case of the crystalline film obtained in Example 1. A surface of the crystalline film was observed by use of SEM, as shown in FIG. 10. The crystalline film was 30 μm in thickness.

Comparative Example 1

A crystalline film was obtained under the same conditions as the conditions of the Example 1 except the following one condition: without supplying the reactive gas (HCl gas) to the substrate. As a result, the film-formation rate of the crystalline film in the Comparative Example 1 became one tenth or less compared to the film-formation rates of the crystalline films in Example 1 and Example 2. Also, the crystalline film obtained in Comparative Example 1 deteriorated in film quality of surface flatness, and the film did not have a mirror surface.

Comparative Example 2

A crystalline film was obtained under the same conditions as the conditions of the Example 2 except the following one condition: without supplying the reactive gas (HCl gas) to the substrate. As a result, the film-formation rate became one tenth or less compared to the film-formation rates of the crystalline films in Example 1 and Example 2. Also, the film obtained in Comparative Example 2 deteriorated in film quality of surface flatness, and the film did not have a mirror surface.

(First Embodiment)

Figure 11:
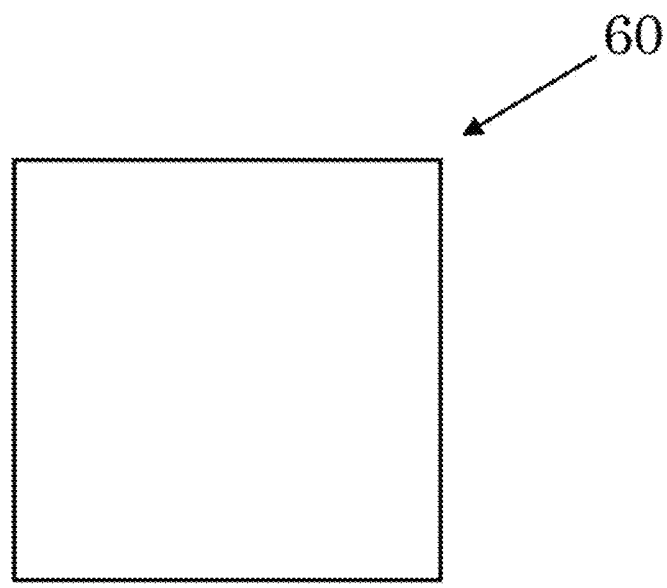
FIG. 11 shows a schematic view of a crystalline film according to an embodiment of a present inventive subject matter.

FIG. 11 shows a schematic view of a crystalline film 60 according to an embodiment of a present inventive subject matter. The crystalline film 60 contains a crystalline metal oxide as a major component and the crystalline film 60 has a corundum structure. In this embodiment, the crystalline metal oxide of the crystalline film 60 contains at least gallium. Also, the crystalline film 60 has a dislocation density that is less than $5 \times 10^6$ cm$^{-2}$. The crystalline film 60 has a surface area that is 9 µm$^2$ or more. Also, as another embodiment, a crystalline film contains a crystalline metal oxide as a major component, and the crystalline metal oxide may contain indium in addition to gallium. Also, it is possible to use the crystalline film in this embodiment as a buffer layer and to form a second crystalline film on the buffer layer that is a first crystalline film. Furthermore, it is possible to use the crystalline film in this embodiment as a semiconductor layer.

Figure 12A:
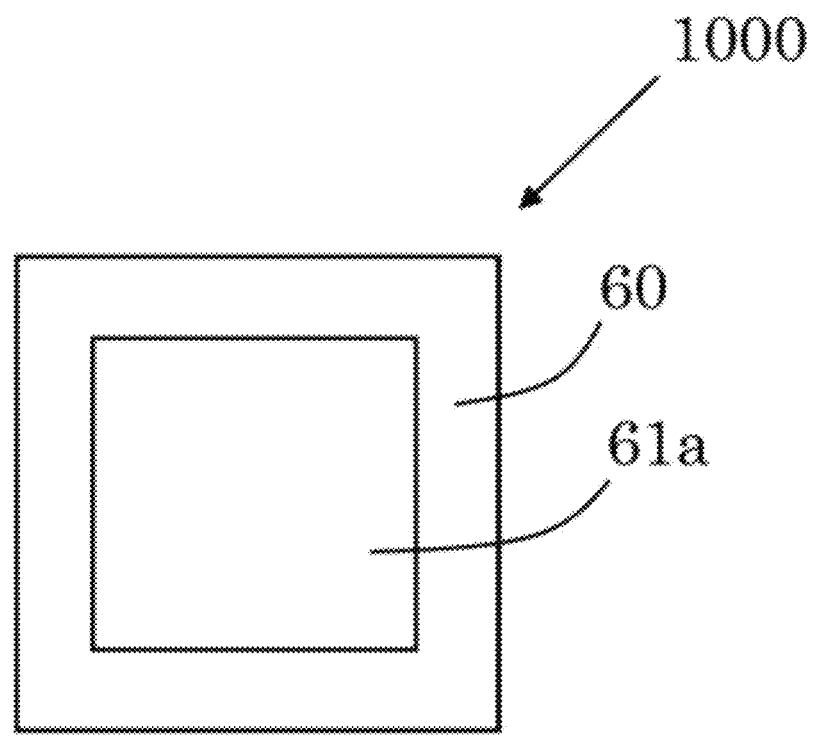
FIG. 12A shows a schematic top plan view of a semiconductor device including a crystalline film according to an embodiment of a present inventive subject matter.
Figure 12B:
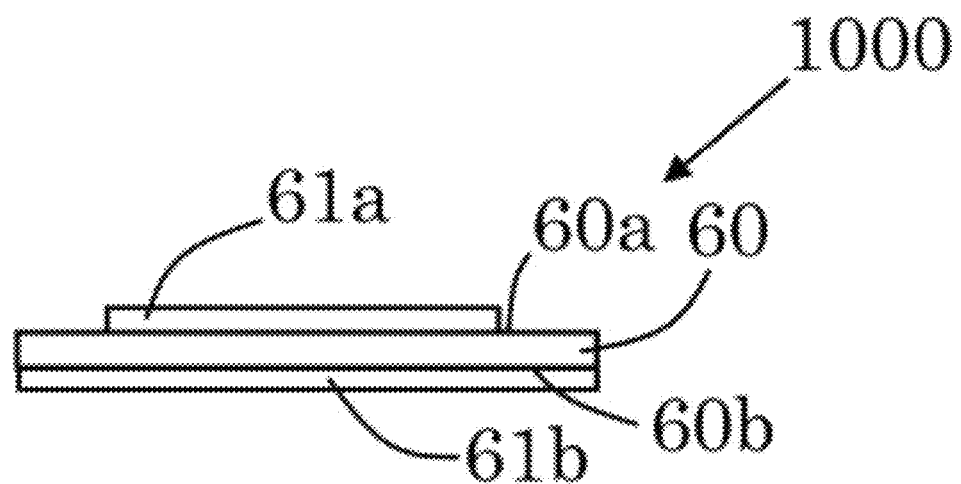
FIG. 12B shows a schematic side view of a semiconductor device including a crystalline film according to an embodiment of a present inventive subject matter.

FIG. 12A shows a schematic top plan view of a semiconductor device 1000 including a crystalline film 60 according to an embodiment of a present inventive subject matter. FIG. 12B shows a schematic side view of a semiconductor device 1000 including a crystalline film 60 according to an embodiment of a present inventive subject matter. The crystalline film 60 in this embodiment contains a corundum-structured crystal containing at least gallium, and impurities may be doped and the crystalline film 60 may be electrically-conductive. The semiconductor device 1000 further includes a first electrode 61a electrically connected to the crystalline film 60, and a second electrode 61b electrically connected to the crystalline film 60. In this embodiment, the first electrode 61a is positioned at a side of a first surface 60a of the crystalline film 60, and the second electrode 61b is positioned at a side of a second surface 60b of the crystalline film 60. The crystalline film 60 may be a multilayered film. For example, if the semiconductor device is a Schottky diode, the first electrode 61a may be an ohmic electrode and the second electrode 61b may be a Schottky electrode. The semiconductor device 1000 shown in FIG. 12A and FIG. 12B is just an example, and a crystalline film according to an embodiment of a present inventive subject matter is able to use in a power device, a power source, and/or a power system.

Reference Example

Various embodiments of crystal growth of crystal films are explained as follows. FIG. 13 shows a schematic view of a substrate with stripe-patterned masks used in an embodiment of a method for producing a crystalline film. The substrate 560 shown in FIG. 13 is a sapphire substrate with stripe-patterned masks 550 arranged on a surface of the sapphire substrate. Elongated masks 70 are arranged in parallel, and an uneven portion of the substrate include the masks 70 and openings each between the two adjacently arranged masks 70 and the surface 71 of the substrate 560 appears between the two adjacently arranged masks 71.

FIG. 14 is a photomicrograph showing a crystalline film with ridges grown on the surface of the substrate and on elongated masks that are arranged to be stripe-patterned on the surface of the substrate, as shown in FIG. 13. The crystalline film with ridges contains a crystalline metal oxide as a major component, and the crystalline film contains a crystalline metal oxide as a major component, and the crystalline metal oxide is α-Ga$_2$O$_3$, which grew to stick out above positions between the stripe-patterned masks.

The shape and the size of the masks are not particularly limited as long as an object of the present inventive matter is not interfered with. For example, a mask including at least one opening may be used according to an embodiment of a method for producing a crystalline film of a present inventive subject matter. FIG. 15A, FIG. 15B, and FIG. 16 are photomicrographs showing progress of crystal growth, using a sheet-shaped mask including openings that pass through the sheet-shaped mask and are arranged at a regular interval. For more details, FIG. 16 is a photomicrograph taken from above, showing crystal growth of α-Ga$_2$O$_3$ further grown onto a mask through two or more openings that are dotted on a surface of a substrate, as a reference example. Islands of crystalline metal oxide grow vertically, laterally and/or radially on the surface of the substrate through the two or more openings onto the mask and adjacent islands starting to coalesce one another. Mask material is not particularly limited, and examples of the mask material include silicon dioxide (SiO$_2$), aluminum oxide (Al$_2$O$_3$), titanium (Ti), and titanium oxide (TiO$_2$) and titanium nitride (TiN), but in embodiments of a present inventive subject matter, mask material is preferably an oxide. Examples of the oxide as the mask material include SiO$_2$ and TiO$_2$. FIG. 15A is a picture taken from above, showing crystal growth of α-Ga$_2$O$_3$ film grown on masks that are dotted on a surface of a substrate, as a reference example. FIG. 15B shows a picture taken from obliquely above, showing crystal growth of α-Ga$_2$O$_3$ film grown on a sheet-shaped mask including two or more openings that pass through the sheet-shaped mask and are positioned on a surface of a substrate, as a reference example.

FIG. 16 is a photomicrograph showing a crystal growth of α-Ga$_2$O$_3$ film further grown on a mask including two or more openings on a surface of a substrate, as a reference example.

Figure 17A:
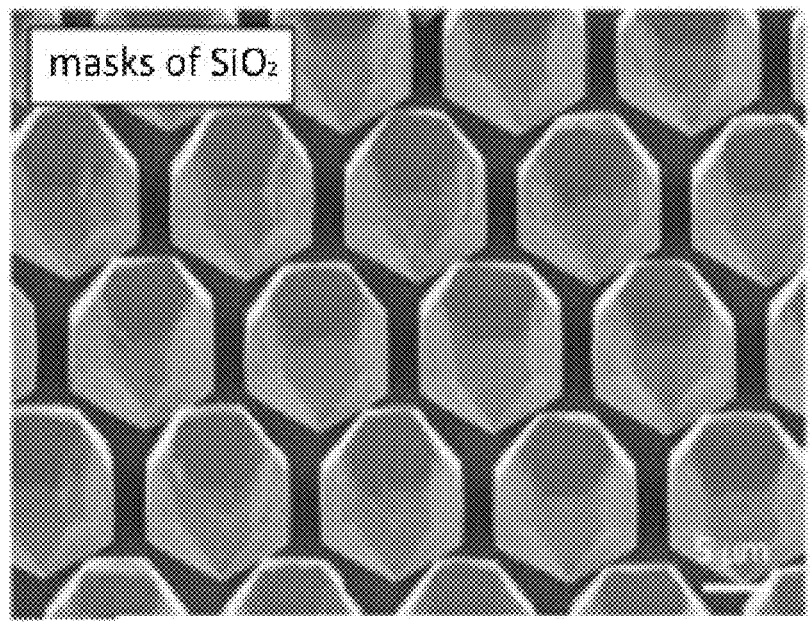
FIG. 17A shows a photomicrograph showing crystal growth of α-Ga$_2$O$_3$ on a mask of SiO$_2$ with two or more openings that pass through the mask and are arranged at a regular interval on a surface of a substrate.
Figure 17B:
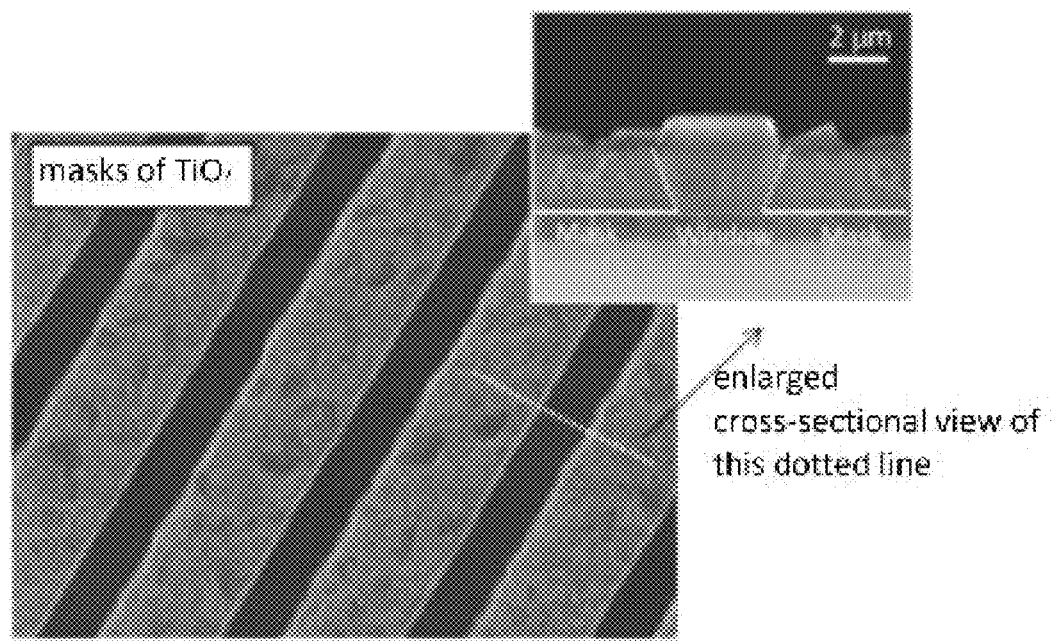
FIG. 17B shows a photomicrograph showing crystal growth of α-Ga$_2$O$_3$ on masks of TiO$_2$ that are two or more elongated masks arranged in parallel on a surface of a substrate.
Figure 18:
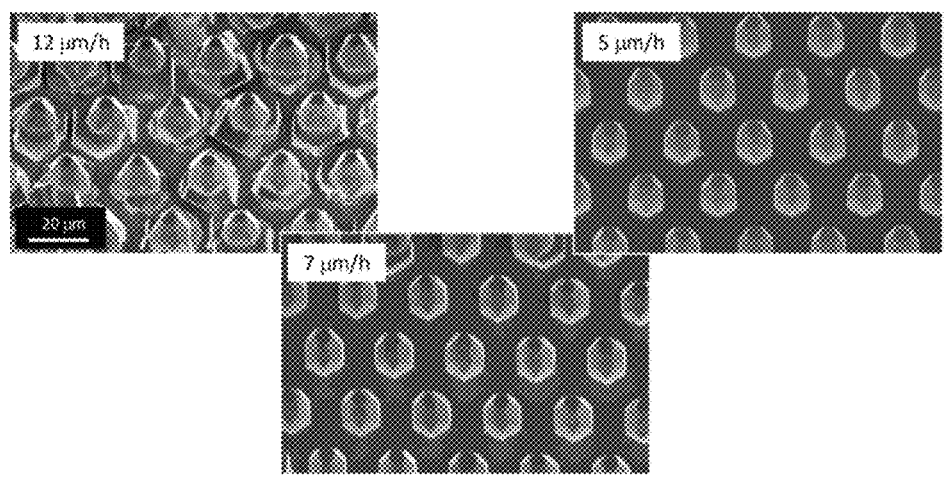
FIG. 18 shows photomicrographs showing crystal growth of α-Ga$_2$O$_3$ with a growth rate of 12 μm/h, crystal growth of α-Ga$_2$O$_3$ film with a growth rate of 7 μm/h, and crystal growth of α-Ga$_2$O$_3$ film with a growth rate of 5 μm/h.
Figure 19:
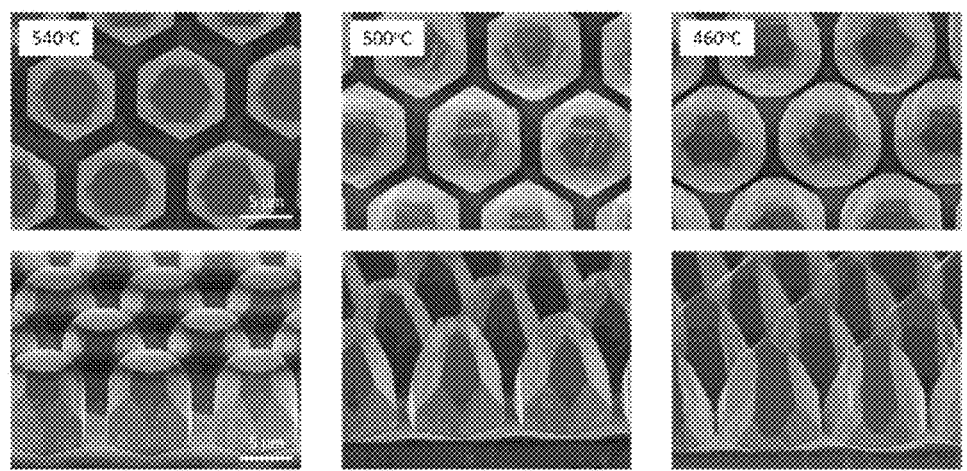
FIG. 19 shows photomicrographs showing crystal growth of α-Ga$_2$O$_3$ film with a growth temperature at 540° C., crystal growth of α-Ga$_2$O$_3$ film with a growth temperature at 500° C., and crystal growth of α-Ga$_2$O$_3$ film with a growth temperature at 460° C.
Figure 20A:
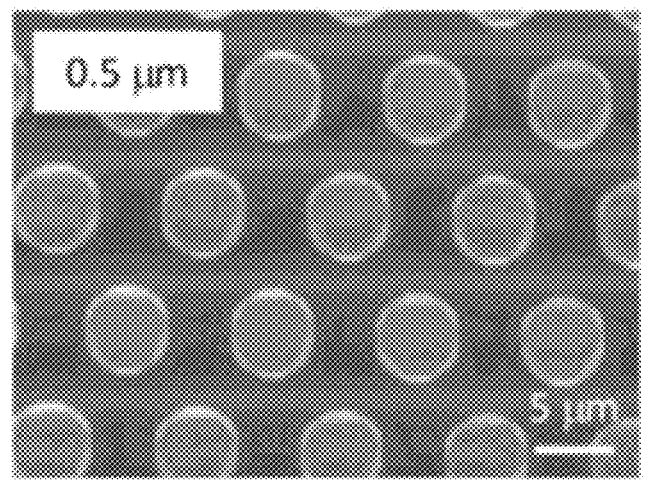
FIG. 20A, FIG. 20B, FIG. 20C and FIG. 20D each with a plan view and a perspective view show crystal growth progress of α-Ga$_2$O$_3$ film on a mask with openings that pass through the mask and are arranged at a regular interval on a surface of a substrate.
Figure 20A:
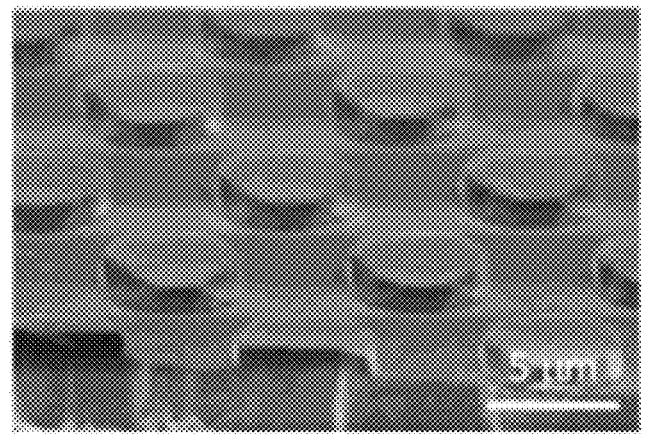
Figure 20B:
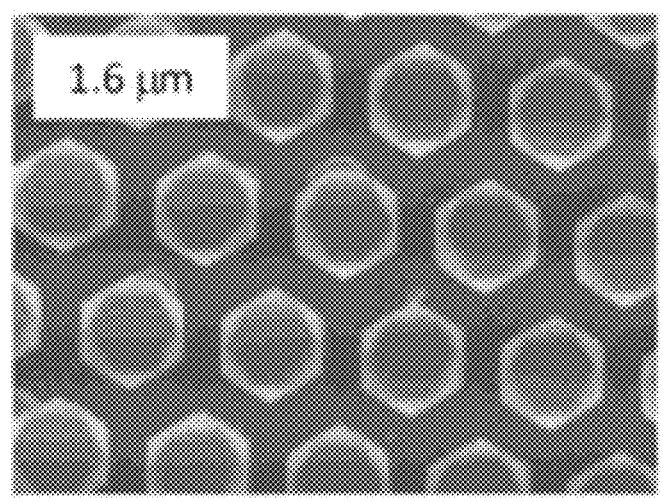
Figure 20B:
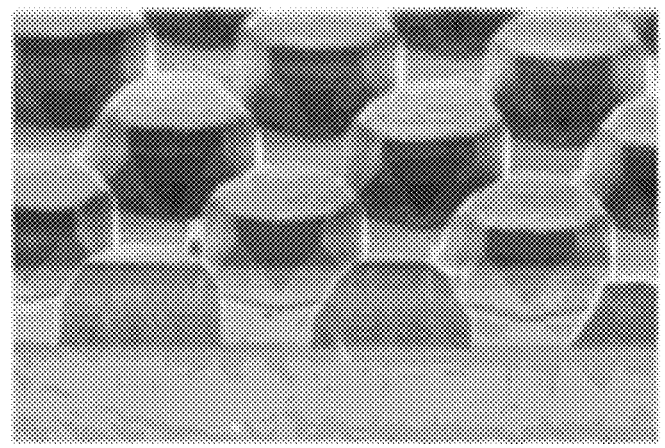
Figure 20C:
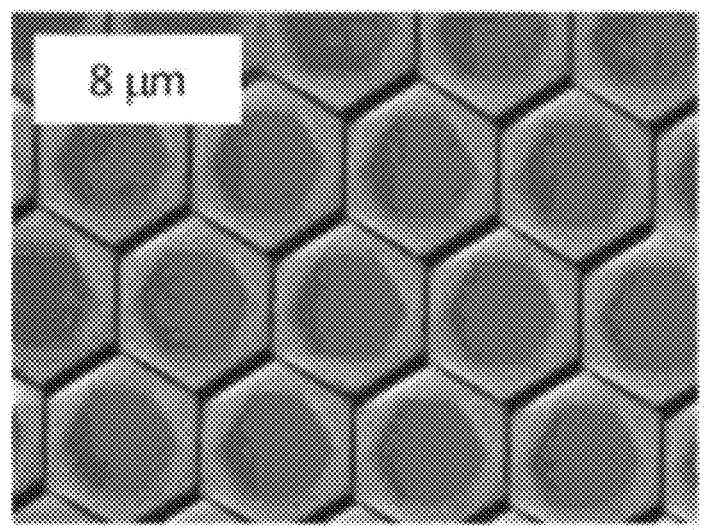
Figure 20C:
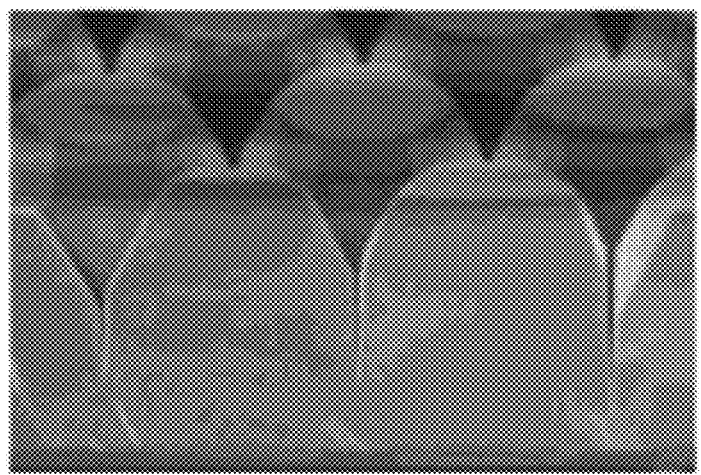
Figure 20D:
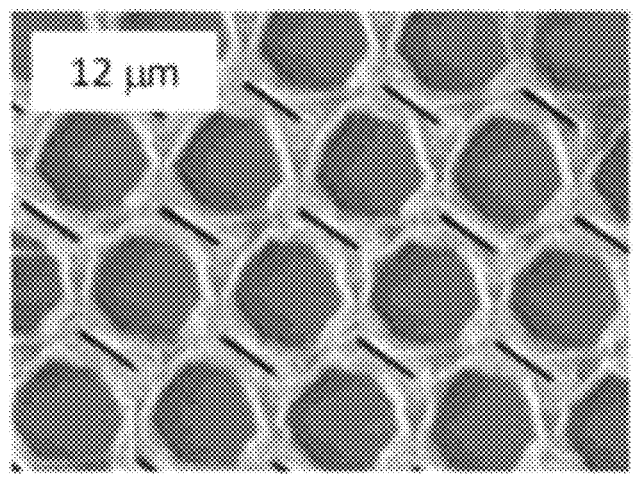
Figure 20D:
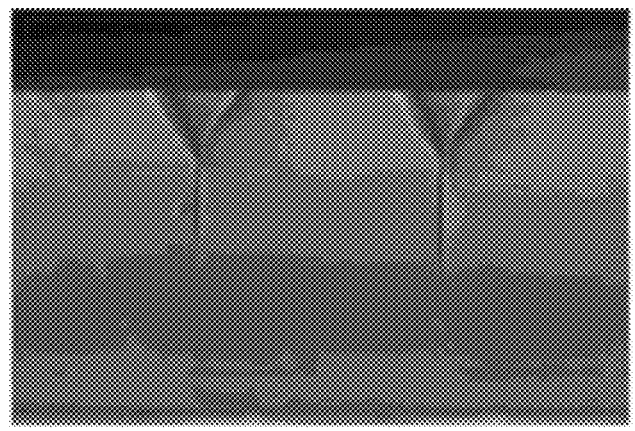

Furthermore, FIG. 17A shows a photomicrograph showing crystal growth of α-Ga$_2$O$_3$ film on a mask of SiO$_2$ with openings through the mask arranged at a regular interval. The mask of SiO$_2$ has a shape of sheet and arranged on a surface of a substrate. FIG. 17B shows a photomicrograph showing crystal growth of α-Ga$_2$O$_3$ film on masks of TiO$_2$ that are two or more elongated masks arranged in parallel on a surface of a substrate. In embodiments of a present inventive subject matter, masks are arranged with a regular interval and openings that may be referred as windows in Figures between adjacent masks. The uneven portion of the substrate in this embodiment preferably include masks and openings. The opening between adjacent masks has a length that is not particularly limited, however, preferably 3 μm or more and 100 μm or less. Also, as shown in FIG. 18, in embodiments of a present inventive subject matter, even the growth rate of crystal is 5 μm/h or more, the crystal film is grown in good quality. The temperature of crystal growth is not particularly limited, however, preferably 460° C. to 540° C. as shown in FIG. 19.

For more details, while the film-formation temperature was 540° C., crystal growth is promoted on a (0001) plane. While the film-formation temperature was 500° C., crystal growth is promoted on a (10$\bar{1}$1) plane. Also, while the film-formation temperature was 460° C., crystal growth is promoted on a (10$\bar{1}$4) plane. According to a method for forming a crystalline film containing gallium oxide as a major component or a crystalline film containing a mixed crystal containing gallium and one or more metals as a major component of a present inventive subject matter, facets of islands of crystalline metal oxide are able to be controlled by changing temperatures of film-formation, and the facets are important to obtain such epitaxially laterally and/or radially grown crystal films in good quality. Facets of islands of crystalline metal oxide may be shown as (10-n), and "n" herein is a natural number. Also, facets of islands of crystalline metal oxide may be shown as (11-2m), and "m" is a natural number. According to an embodiment of a crystalline film of a present inventive subject matter, the crystalline film is an α-$Ga_2O_3$ crystalline film including epitaxial lateral overgrowth of gallium oxide grown in a direction perpendicular to a (10$\bar{1}$4) plane. The crystalline film has a dislocation density that is less than $5 \times 10^6$ $cm^{-2}$.

It is possible to obtain a crystalline film containing a crystalline metal oxide as a major component and including epitaxial lateral overgrowth of gallium oxide grown in a direction perpendicular to a (10$\bar{1}$14) plane by setting the film-formation temperature to 460° C. or less. The crystalline metal oxide contains at least gallium. Also, according to another embodiment of a crystalline film, a crystalline film contains a crystalline metal oxide containing gallium and one or more metals selected from among aluminum, indium, iron, chromium, vanadium, titanium, rhodium, nickel, cobalt, and iridium.

Also, according to an embodiment of a crystalline film of a present inventive subject matter, the crystalline film contains a mixed crystal containing gallium and one or more metals including epitaxial lateral overgrowth grown in at least a direction perpendicular to a (10$\bar{1}$4) plane. The crystalline film has a dislocation density that is less than $5 \times 10^6$ $cm^{-2}$.

Also, for reference, progress of crystal growth is shown in FIG. 20A, FIG. 20B, FIG. 20C and FIG. 20D. In this embodiment, the mask has a sheet shape including two or more openings arranged through the mask, and a crystalline metal oxide is grown through the opening as islands. Islands of crystalline metal oxide grow vertically, laterally and/or radially through the openings as islands, and further grow onto the mask to coalesce.

Figure 21:
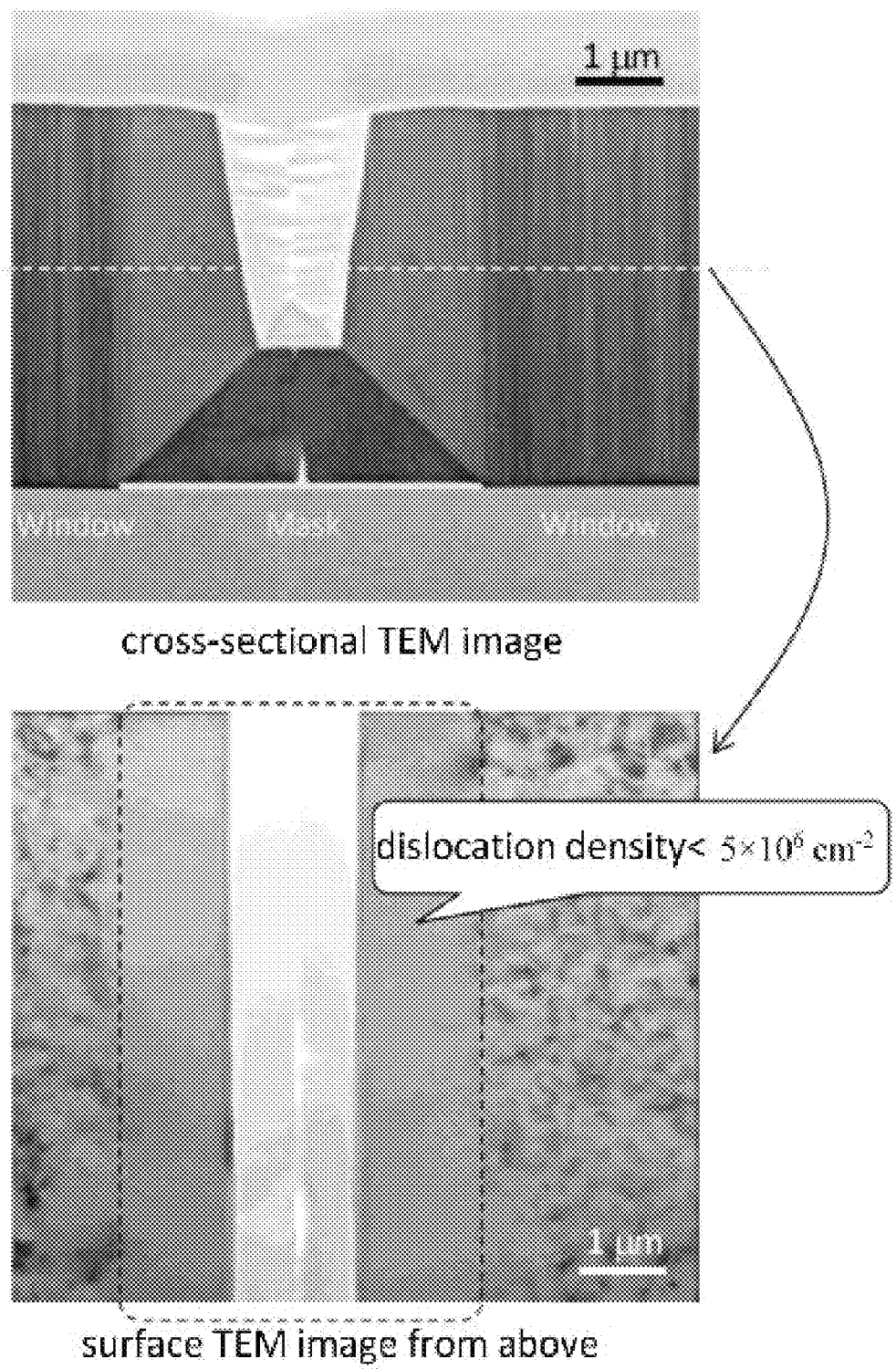
FIG. 21 shows an explanatory drawing explaining the shape of an area in that a dislocation density that is less than $5 \times 10^6$ cm$^{-2}$.
Figure 26:
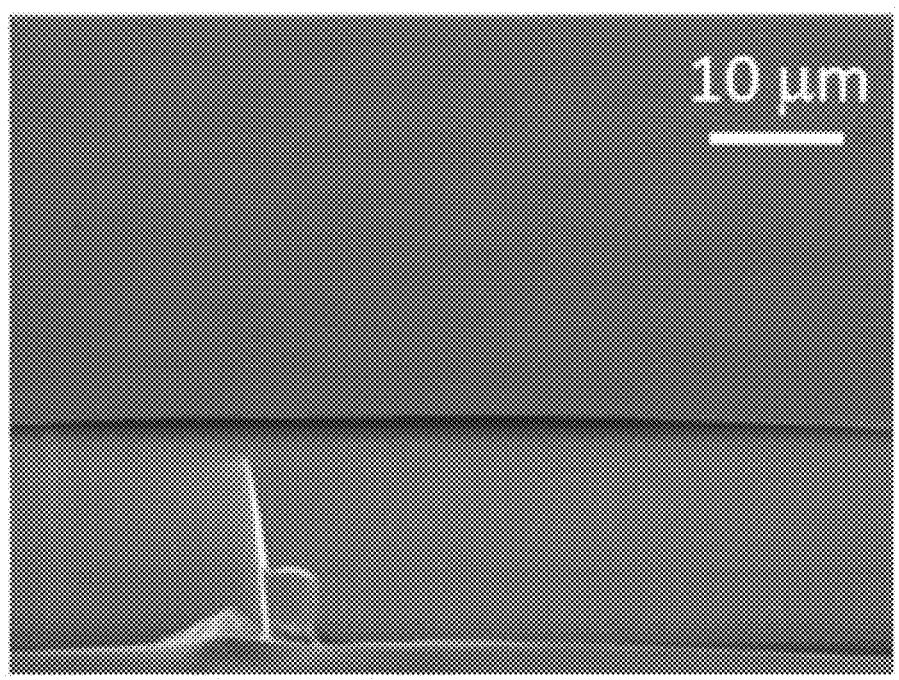
FIG. 26 shows a perspective SEM image of a crystalline film containing a crystalline metal oxide as a major component and epitaxially laterally overgrown and coalesced to be a crystalline film.

Also, FIG. 21 shows a crystal grown to form an area with a lower dislocation density. The crystal is grown on a surface of a substrate and an elongated mask is arranged between elongated openings that are indicated as windows in FIG. 21. Furthermore, the area with a lower dislocation density is enlarged to form a corundum-structured crystalline film with a larger area and a lower dislocation density. The crystalline film shown in FIG. 21 is further grown to obtain a crystalline film that is flat and shown in FIG. 26. FIG. 26 shows a perspective SEM image of a crystalline film containing a crystalline metal oxide as a major component and epitaxially laterally overgrown and coalesced to be a crystalline film that is in good quality. The crystalline film has a surface area that is 1 $mm^2$ or more with a dislocation density that is less than $5 \times 10^6$ $cm^{-2}$.

Figure 22:
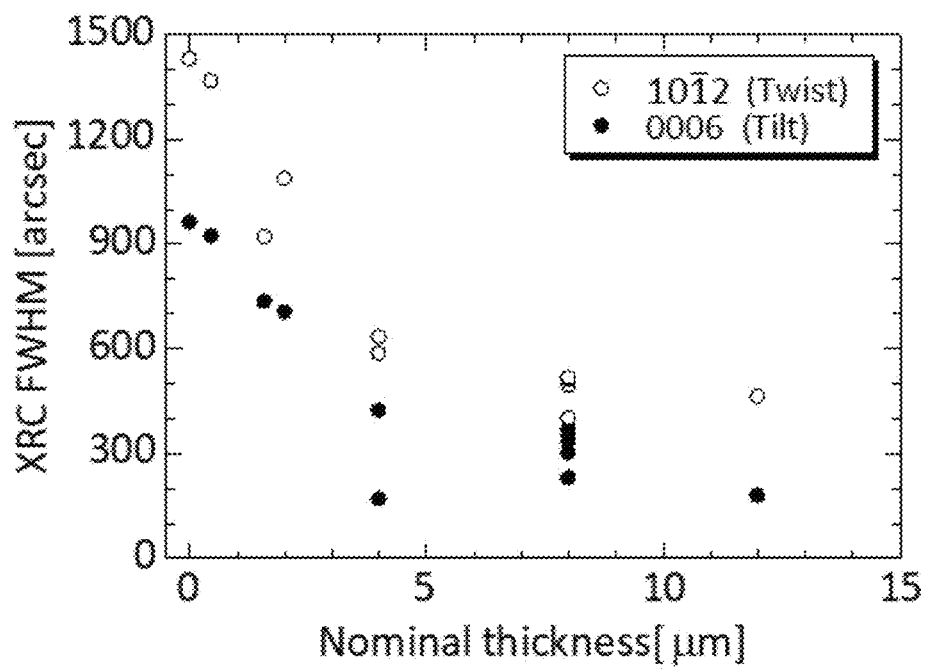
FIG. 22 indicates a relationship of film growth thickness and a full width at half maximum of x-ray rocking curve (XRC FWHM)
Figure 23:
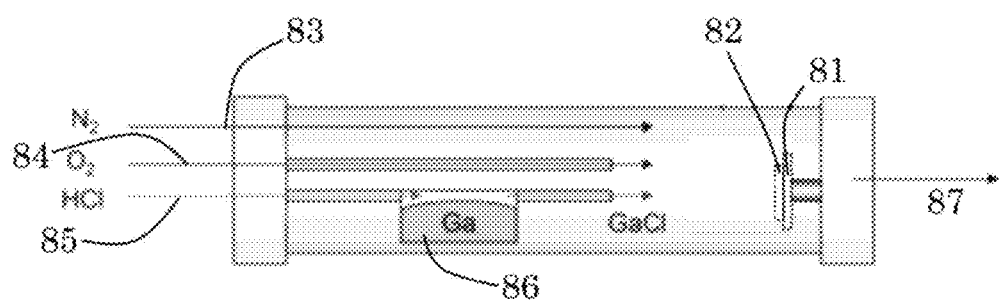
FIG. 23 shows a schematic view of an (HVPE) apparatus that is used in embodiments of a method for producing a crystalline film according to a present inventive subject matter.

FIG. 22 indicates a relationship of film growth thickness and a full width at half maximum (FWHM) of x-ray rocking curve (XRC). FIG. 22 clearly shows that, as crystal growth progressed, crystallinity of the crystal film became better.

EXAMPLE 3

3-1. Film Formation of a First Crystalline Film

A first crystalline film with 3 μm in thickness was obtained on a PSS including masks that are triangular pyramids with apexes arranged with a regular interval of 1 μm in a triangular lattice by the same conditions as the conditions of Example 2 except the following three conditions: a flow rate of $O_2$ gas was maintained to be 100 sccm, the film-formation temperature was 540° C. and the film-formation time was 15 minutes. Also, an uneven portion was formed on a surface of the first crystalline film that was obtained. The uneven portion of the first crystalline film include $SiO_2$ masks in the shape of triangular lattice with openings in the shape of circle with φ5 μm. The distance between an edge of a first adjacent opening and an edge of a second adjacent opening was 5 μm.

3-2 Film-Formation of a Second Crystalline Film

A second crystalline film with 24 μm in thickness was obtained by the same conditions as the conditions to form the first crystalline film at 3-1 except the following two conditions: the film-formation temperature was 520° C. and the film-formation time was two hours. After the second crystalline film was formed, an associating interface of the second crystalline film was observed by use of a microscope.

FIG. 24A shows a microphotograph showing a perspective view of the second crystalline film, as a result and also shows a schematic cross-sectional view of a layered structure including a second crystalline film obtained according to an embodiment of a present inventive subject matter, and also shows a photomicrograph of a coalescence of epitaxial lateral overgrowth to be the second crystalline film.

Figure 24:
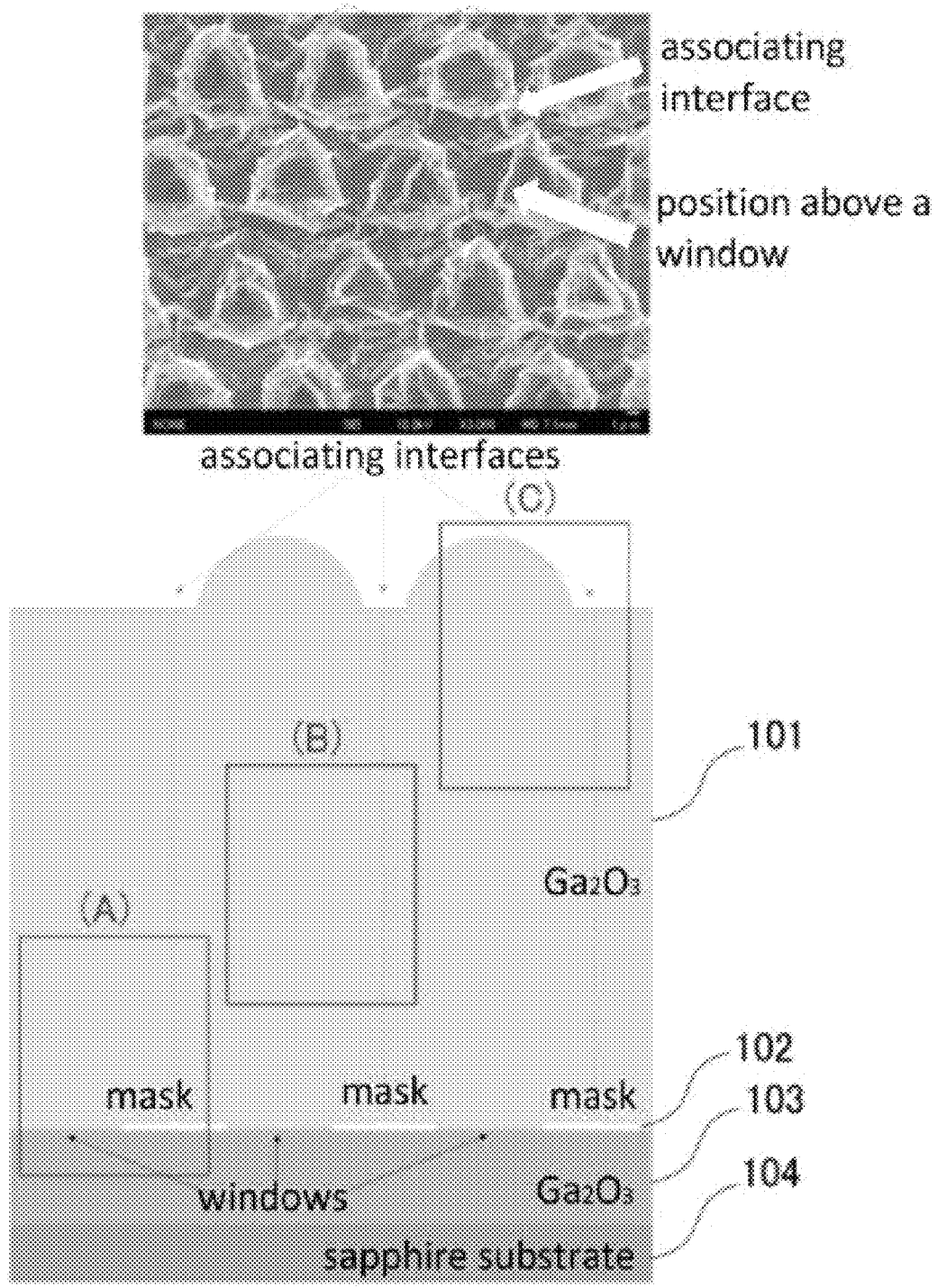
FIG. 24 shows a schematic cross-sectional view of a layered structure including a second crystalline film obtained according to an embodiment of a present inventive subject matter, and also shows a photomicrograph of a coalescence of epitaxial lateral overgrowth to be the second crystalline film.
Figure 25C:
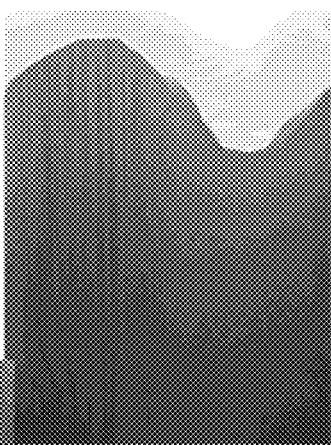
FIG. 25A, FIG. 25B and FIG. 25C show cross-sectional TEM images in arbitrary positions shown in FIG. 24 with indications of (A), (B) and (C).
Figure 25B:
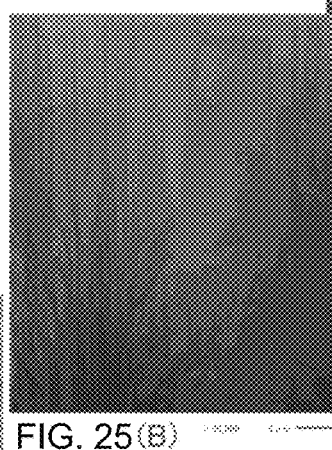
Figure 25A:
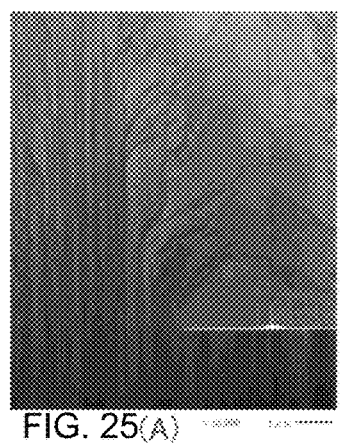

FIG. 25(A), (B) and (C) show cross-sectional TEM images in positions shown in FIG. 24 with the same indications of (A), (B) and (C).

The position (A) of FIG. 24 shows the second crystalline film at a position adjacent to the first crystalline film 103 and a mask 102 with openings that are indicated as windows in FIG. 24. The position (B) of FIG. 24 shows the second crystalline film at a position that is more grown and increased in thickness than the position (A). The position (C) of FIG. 24 shows the second crystalline film at a position that is more grown and increased in thickness than the position (B), showing the associating interface of the second crystalline film 101 above the mask appears to be recessed among concaves and has a good crystallinity. Above the openings of the mask in the schematic cross-sectional view and the microphotograph of FIG. 24, convex portions were observed. It was found that the more the second crystalline film increased in thickness, the better the crystallinity of the second crystalline film became.

As shown in TEM images, the second crystalline film 101 containing a crystalline metal oxide as a major component, and an epitaxially vertically, laterally, and/or radially overgrown above masks and coalesced portion found to have good crystallinity.

Also, according to a seventh aspect of a present inventive subject matter, a method for producing a crystalline film includes: gasifying a metal source to turn the metal source into a metal-containing raw-material gas; supplying the metal-containing raw-material gas and an oxygen-containing raw-material gas into a reaction chamber onto a substrate on that an uneven portion is arranged; and supplying a reactive gas into the reaction chamber onto the substrate to grow a crystalline film on the uneven portion on the substrate under a gas flow of the reactive gas. The uneven portion on the substrate may be grooves. Furthermore, it is suggested that the method for producing a crystalline film may include forming grooves on a surface of the substrate as the uneven portion.

EXAMPLE 4

A crystalline film was obtained by the same conditions as the conditions to form the crystalline film at Example 1 except the following six conditions: using an m-plane sapphire substrate including lattice-shaped grooves with vertical grooves and lateral grooves arranged at a regular interval that is 1.5 mm and formed by laser irradiation instead of using the PSS substrate with the buffer layer with a regular interval of 1 μm of Example 1; setting the film-formation temperature to 520° C.; the film-formation time of Example 4 was 15 minutes, the flow rate of HCl gas supplied from the supply device 54a of reactive gas was 10 sccm, and the flow gas rate of $O_2$ supplied from the supply device 55a of oxygen-containing raw-material gas was 100 sccm.

Figure 27A:
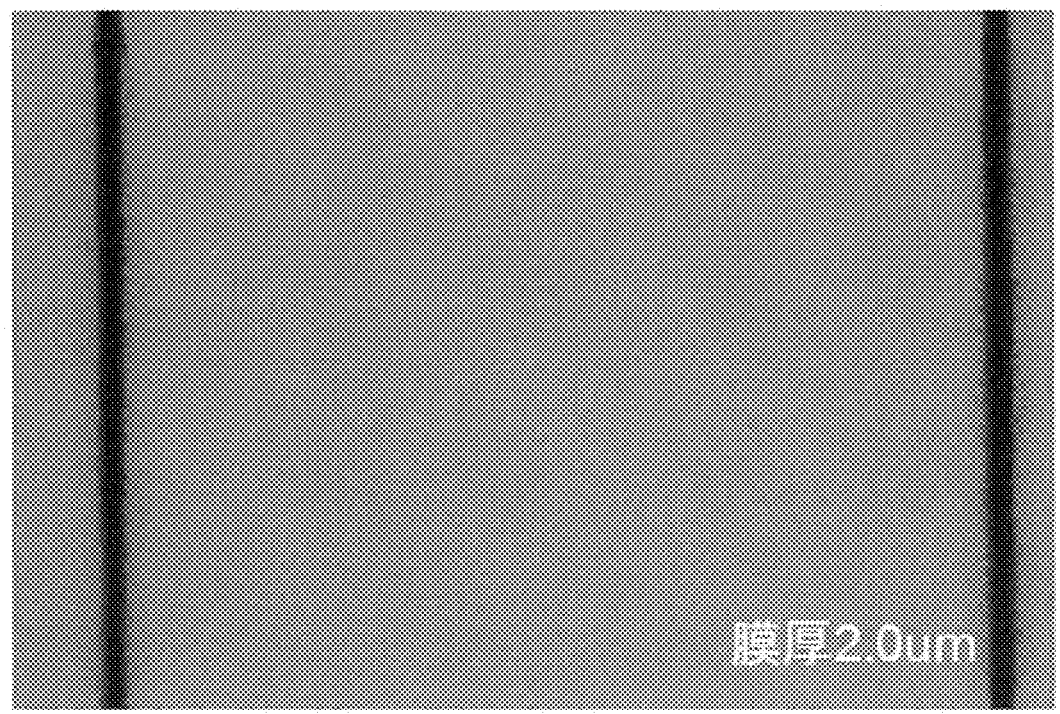
FIG. 27A shows an image of a surface of a crystalline film that was obtained at Example 4 and observed by a Nomarski microscope.

The crystalline film obtained in Example 4 was 2.0 μm in thickness and observed by a Nomarski microscope as shown in FIG. 27A, and the crystalline film was a crystalline film in good quality without a crack. The lines shown in FIG. 27A are a part of the lattice-shaped grooves on the m-plane sapphire substrate and seen through the crystalline film. Grooves of the substrate are considered to suppress cracks of a crystalline film to be grown on the substrate.

Comparative Example 3

Figure 27B:
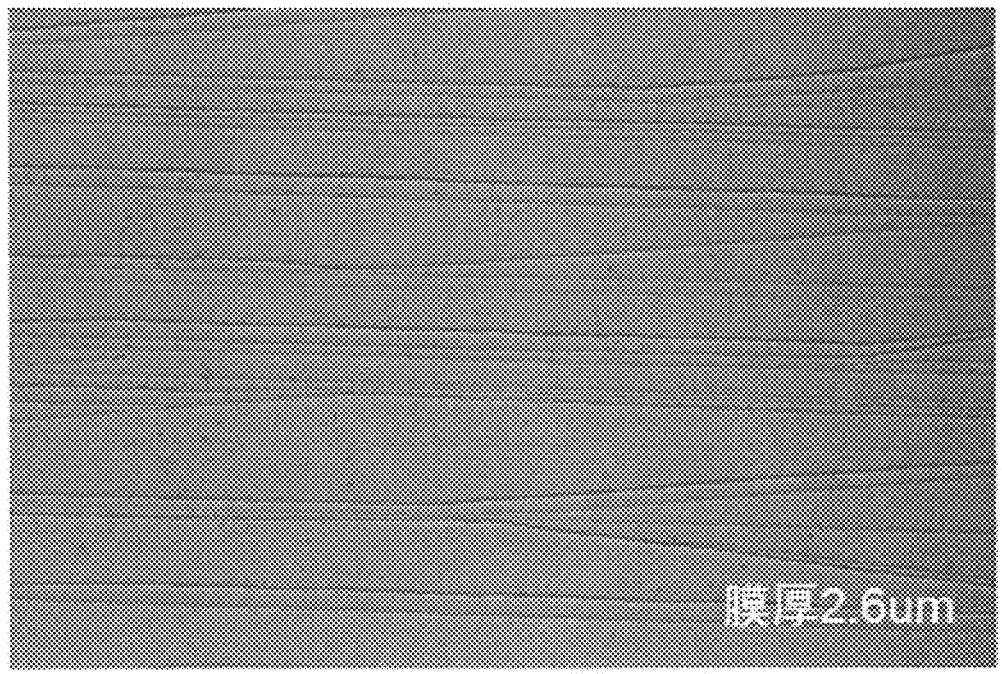
FIG. 27B shows an image of a surface of a crystalline film that was obtained at Comparative Example 3 and observed by a Nomarski microscope.

A crystalline film was obtained by the same conditions as the conditions to form the crystalline film at Example 4 except the following two conditions: using an m-plane sapphire substrate without grooves; and setting the film-formation temperature to 540° C. The crystalline film obtained in Comparative Example 3 was 2.6 μm in thickness and observed by a Nomarski microscope as shown in FIG. 27B, and the crystalline film had numerous cracks. Also, it was found that cracks tend to occur in a crystalline film grown on an m-plane sapphire substrate without grooves and grown to be 1 μm or more in thickness.

EXAMPLE 5

A crystalline film was obtained by the same conditions as the conditions to form the crystalline film at Example 1 except the following six conditions: using a buffer layer arranged on an m-plane sapphire substrate that is without a pattern; arranging a sheet-shaped $SiO_2$ mask including two or more openings on the buffer layer on the m-plane sapphire substrate; forming the crystalline film on the buffer layer and the $SiO_2$ mask on the buffer layer; setting the film-formation temperature to 540° C.; setting the film-formation time to 120 minutes; and setting the flow gas rate of $O_2$ to 10 sccm.

The two or more islands of crystalline metal oxide at the two or more openings of the $SiO_2$ mask on the buffer layer of the substrate are grown. In this embodiment, the two or more islands of the crystalline metal oxide coalesce to form an epitaxial lateral overgrowth layer of the crystalline metal oxide and finally form the crystalline film.

Figure 28A:
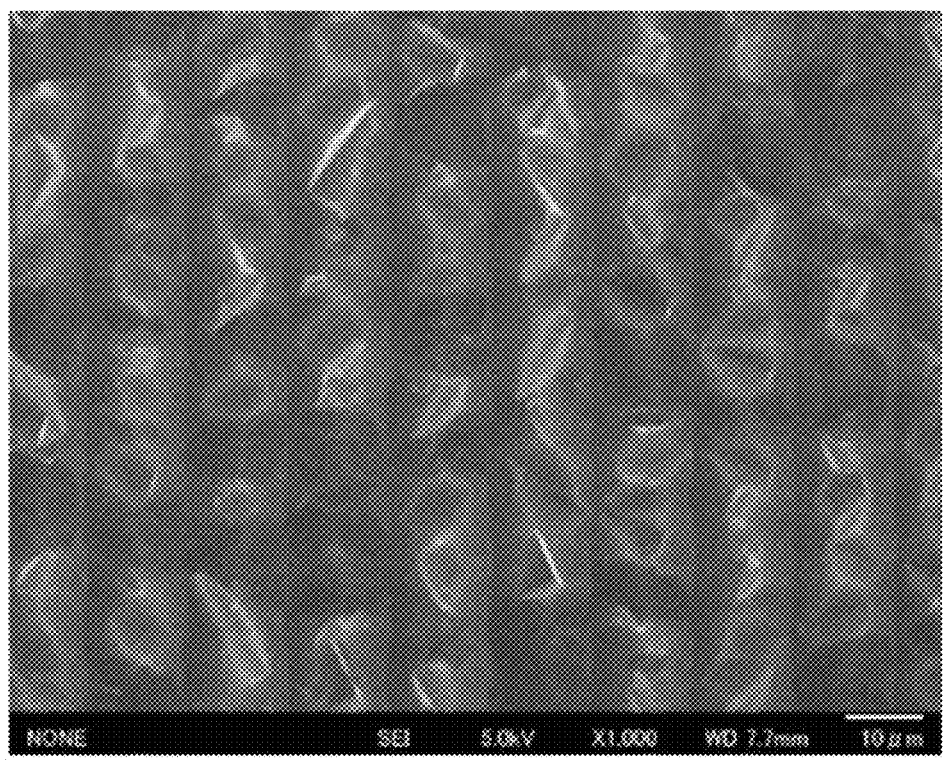
FIG. 28A shows a perspective SEM image of the crystalline film obtained at Example 5.
Figure 28B:
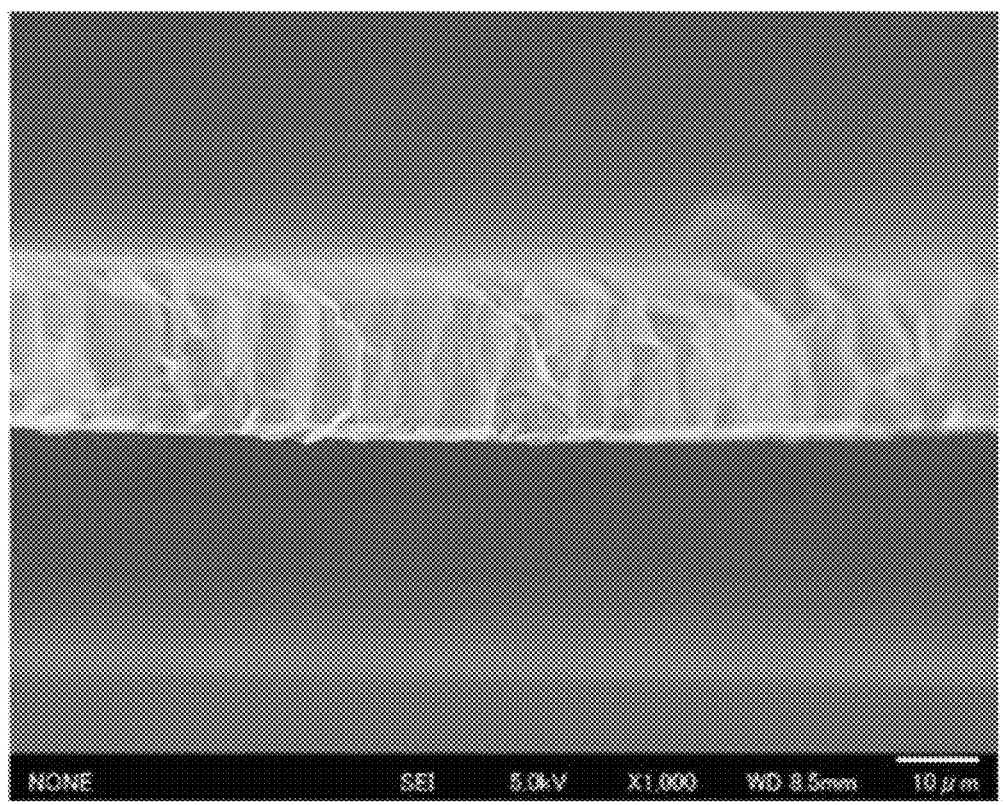
FIG. 28B shows a cross-sectional SEM image of the crystalline film obtained at Example 5.

FIG. 28A shows a perspective SEM image of the crystalline film obtained at Example 5, and FIG. 28B shows a cross-sectional SEM image of the crystalline film obtained at Example 5. The crystalline film obtained at Example 5 was 20 μm in thickness. It was found that using an m-plane sapphire substrate and the buffer layer and the masks mentioned above, a crystalline film that is an epitaxial lateral overgrowth layer is easily obtained. Also, it is possible to obtain a crystalline film separated from at least the substrate.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

A crystalline film according to an embodiment of a present inventive subject matter is able to be used in various devices including semiconductor devices, power devices including inverters, electronic devices, optical devices, power sources and power systems.

REFERENCE NUMBER DESCRIPTION a a regular interval
1 a substrate
1a a surface of the substrate 1
2a a mask
2b an opening
3 a crystalline film
4 a mask layer
5 a buffer layer
19 a mist CVD apparatus
20 an object on which a film is to be formed
21 a stand to support an object
22a a carrier gas supply device
22b a dilution carrier gas supply device
23a a flow-control valve of carrier gas
23b a flow-control valve of dilution carrier gas 24 a mist generator
24a a raw material solution
25 a vessel
25a water
26 an ultrasonic transducer
27 a film-formation chamber
28 a heater
50 a halide vapor phase epitaxy (HVPE) apparatus
52a a heater
52b a heater
53a a supply device of halogen-containing raw-material gas
53b a supply tube of metal-containing raw-material gas
54a a supply device of reactive gas
54b a supply tube of reactive gas
55a a supply device of oxygen-containing raw material gas
55b a supply tube of oxygen-containing raw material gas
56 a substrate holder
57 a metal source
58 a protection sheet
59 a gas-discharge portion
60 a crystalline film
60a a first side of a crystalline film
60b a second side of a crystalline film
61a a first electrode
61b a second electrode
70 a mask portion
71 a substrate portion
101 a second crystalline film
102 a mask
103 a first crystalline film
104 a substrate
550 a mask
560 a sapphire substrate
1000 a semiconductor device

What is claimed is:

1. A crystalline film comprising:
a crystalline metal oxide as a major component;
the crystalline film comprising a corundum structure, a surface area that is 9 $\mu m^2$ or more, and a dislocation density that is less than $5 \times 10^6$ $cm^{-2}$.

2. The crystalline film of claim 1, wherein
the surface area that is 9 $\mu m^2$ or more comprises an epitaxial lateral overgrowth layer of the crystalline metal oxide.

3. The crystalline film of claim 1, wherein
the crystalline film comprises an epitaxial lateral overgrowth of the crystalline metal oxide grown in at least a direction perpendicular to a (10$\bar{1}$4) plane.

4. The crystalline film of claim 1, wherein
the crystalline film comprises a dopant.

5. A crystalline film comprising:
a crystalline metal oxide as a major component; and
an epitaxial lateral overgrowth of the crystalline metal oxide grown in at least a direction perpendicular to a (10$\bar{1}$4) plane.

6. The crystalline film of claim 5, wherein
the crystalline metal oxide comprises gallium, a surface area that is 9 $\mu m^2$ or more, and a dislocation density that is less than $5 \times 10^6$ $cm^{-2}$.

7. The crystalline film of claim 6, wherein
the crystalline metal oxide further comprises at least one metal selected from among aluminum, indium, iron, chromium, vanadium, titanium, rhodium, nickel, cobalt, and iridium.

8. The crystalline film of claim 6, wherein
the crystalline film comprises a dopant.

9. A semiconductor device comprising:
the crystalline film of claim 4;
a first electrode electrically connected to the crystalline film; and
a second electrode electrically connected to the crystalline film.

10. A semiconductor device comprising:
the crystalline film of claim 5.

11. A method for producing a crystalline film comprising:
gasifying a metal source to turn the metal source into a metal-containing raw-material gas;
supplying the metal-containing raw-material gas and an oxygen-containing raw-material gas into a reaction chamber onto a substrate on that an uneven portion comprising at least one mask and/or at least one opening is arranged; and
supplying a reactive gas into the reaction chamber onto the substrate to grow at least one island of crystalline metal oxide vertically, laterally and/or radially at the at least one opening of the uneven portion on the substrate under a gas flow of the reactive gas such that the at least one island of crystalline metal oxide forms an epitaxial lateral overgrowth layer of crystalline metal oxide.

12. The method of claim 11, wherein
the reactive gas is an etching gas.

13. The method of claim 11, wherein
the reactive gas comprises at least one selected from among hydrogen halide and groups comprising halogen and hydrogen.

14. The method of claim 11,
wherein the at least one mask of the uneven portion comprises a sheet-shaped mask with the at least one opening comprising two or more openings arranged on a surface of the substrate, and
wherein the two or more openings of the sheet-shaped mask on the substrate are regularly arranged on the surface of the substrate.

15. The method of claim 11, wherein
the substrate is heated at a temperature that is in a range of 400° C. to 700° C.

16. The method of claim 11,
wherein the metal source comprises a gallium source, and
wherein the metal-containing raw-material gas comprises a gallium-containing raw-material gas.

17. The method of claim 11, wherein
the gasifying the metal source is done by halogenating the metal source.

18. The method of claim 11, wherein
the oxygen-containing raw-material gas comprises at least one selected from among oxygen ($O_2$), water ($H_2O$) and nitrous oxide ($N_2O$).

19. The method of claim 11, wherein
the substrate comprises a corundum structure, and the crystalline film comprises a corundum structure.

20. The method of claim 11,
wherein the substrate further comprises a buffer layer formed by use of a mist chemical vapor deposition (CVD) method on at least a surface of the substrate, and
wherein the uneven portion on the substrate is positioned on the buffer layer.

21. The method of claim 11, wherein
the forming the crystalline film of metal oxide under the gas flow of the reactive gas is done by use of a halide vapor phase epitaxy (HVPE) method.

22. The method of claim 11, wherein the forming the crystalline film of metal oxide is done at a growth rate that is 5 μm/h or more.

23. The method of claim 22, wherein the forming the uneven portion on the surface of the first crystalline film is done by arranging at least one mask comprising two or more metals, a metal compound, and/or a nonmetallic compound on the surface of the first crystalline film.

24. The method of claim 11, wherein the at least one mask of the uneven portion comprises two or more elongated masks arranged in parallel with the at least one opening positioned between adjacently arranged two of the elongated masks.

25. The method of claim 24, wherein the first crystalline film comprises a crystalline gallium oxide as a major component or a mixed crystal as a major component comprising gallium and one or more metals, and wherein the second crystalline film comprises a crystalline gallium oxide as a major component or a mixed crystal as a major component comprising gallium and one or more metals.

26. The method of claim 11, wherein the at least one mask of the uneven portion comprises dot-patterned masks that are arranged at a regular interval that is in a range of 3 μm or more to 100 μm or less.

27. The method of claim 26, wherein the first crystalline film comprises a crystalline gallium oxide as a major component or a mixed crystal as a major component comprising gallium and one or more metals, and wherein the second crystalline film comprises a crystalline gallium oxide as a major component or a mixed crystal as a major component comprising gallium and one or more metals.

28. The method of claim 11 further comprising:

forming an uneven portion on a surface of the crystalline film that is a first crystalline film of the crystalline oxide; and forming a second crystalline film on the uneven portion on the surface of the first crystalline film of the crystalline oxide.

29. The method of claim 28, wherein the first crystalline film is formed as a sacrificial layer that is to be peel-off such that the second crystalline film is separable from the uneven portion on the surface of the first crystalline film.

* * * * *